US007492641B2

United States Patent
Hosono et al.

(10) Patent No.: US 7,492,641 B2
(45) Date of Patent: Feb. 17, 2009

(54) NON-VOLATILE SEMICONDUCTOR MEMORY DEVICE

(75) Inventors: Koji Hosono, Fujisawa (JP); Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 11/455,823

(22) Filed: Jun. 20, 2006

(65) Prior Publication Data

US 2006/0291291 A1    Dec. 28, 2006

(51) Int. Cl.
 G11C 16/06 (2006.01)
(52) U.S. Cl. ............... 365/185.22; 365/185.21; 365/196; 365/189.09
(58) Field of Classification Search ............ 365/185.22, 365/185.21, 196, 189.09
See application file for complete search history.

(56) References Cited

U.S. PATENT DOCUMENTS

| 6,643,188 B2 | 11/2003 | Tanaka et al. | |
| 6,657,891 B1 | 12/2003 | Shibata et al. | |
| 7,139,192 B1 * | 11/2006 | Wong | 365/185.03 |
| 2002/0003722 A1 | 1/2002 | Kanda et al. | |
| 2004/0264264 A1 * | 12/2004 | Yaegashi et al. | 365/199 |

FOREIGN PATENT DOCUMENTS

JP    2000-113686    4/2000

* cited by examiner

*Primary Examiner*—Thong Q Le
(74) *Attorney, Agent, or Firm*—Oblon, Spivak, McClelland, Maier & Neustadt, P.C.

(57) ABSTRACT

A non-volatile semiconductor memory device includes a memory cell array and a sense amplifier, the device being internally controlled to execute a write sequence with write pulse applications and write-verify operations repeated for writing a set of memory cells selected in the memory cell array, wherein the sense amplifier performs a write speed verify operation for detecting write speed of plural memory cells to be written into a certain data state after a certain write pulse application at the beginning of the write sequence, thereby getting discriminating data for classifying the plural memory cells into first and second cell groups, and after the write speed verify operation, the first and second cell groups are alternately written on different write conditions from each other with reference to the discriminating data.

19 Claims, 34 Drawing Sheets

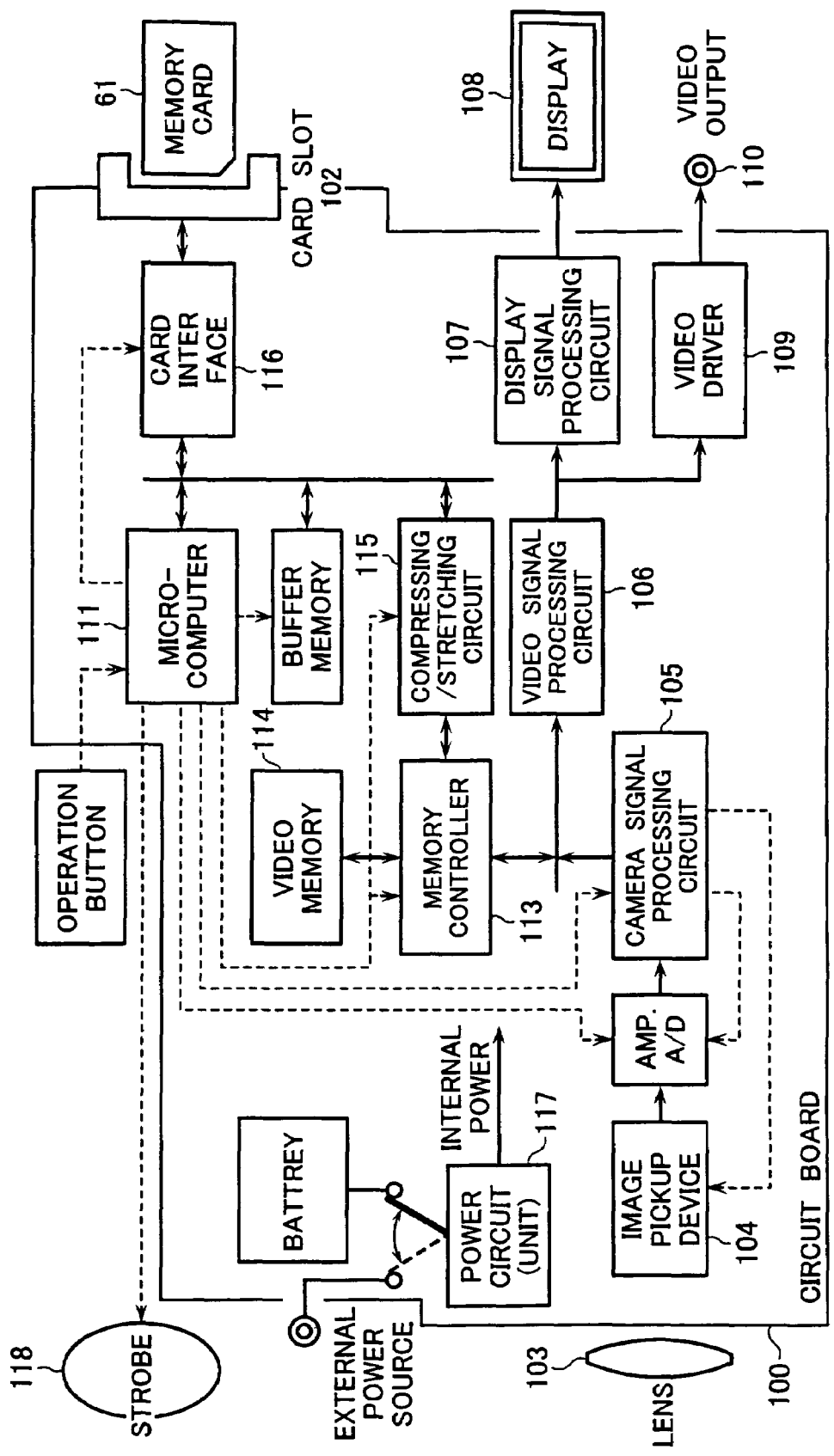

NON-VOLATILE SEMICONDUCTOR MEMORY DEVICE

CROSS-REFERENCE TO RELATED APPLICATION

This application is based on and claims the benefit of priority from the prior Japanese Patent Application No. 2005-181879, filed on Jun. 22, 2005, the entire contents of which are incorporated herein by reference.

BACKGROUND OF THE INVENTION

1. Field of the Invention

This invention relates to an electrically rewritable and non-volatile semiconductor memory device, specifically to a high-speed data write method thereof.

2. Description of the Related Art

A NAND-type flash memory is known as one of electrically erasable and programmable ROMs (EEPROMs). This flash memory has a memory cell structure with a small unit cell area of about $4F^2$ (F: minimum device feature size), thereby leading other EEPROMs in miniaturization and capacity. In case a multi-value or multi-level data storage scheme is adapted to this memory, in which a memory cell stores two or more bits, the capacity may be increased double or more without increasing the chip area.

The NAND-type flash memory is currently adapted to a non-volatile data storage media in various mobile apparatuses. In these applications, it is required of the flash memory to be not only increased in capacity but also improved in access speed. At present, the access speed of the data storage media is strongly influenced by that of the NAND-flash memory. Therefore, it is a problem how to improve the programming throughput of this flash memory.

Data program or write of the NAND-type flash memory is performed with an FN tunneling current. To control data write thereof, it is used such a method that a write pulse application operation and a write-verify operation followed it are repeatedly performed with stepping-up the write pulse voltage. In this method, a write time will be substantially determined based on a difference of the amount of threshold shift between higher write speed cells and lower write speed ones and the voltage step width of the write pulse.

The detail will be explained below. The number of write cycles, which is necessary for writing a desired threshold voltage, is obtained by dividing a threshold voltage distribution obtained with one write pulse application, which expresses write speed differences among cells, by a voltage step of the write pulse, and the write time is proportional to about the number of write cycles. In case of a binary data storage scheme, only one mode of the threshold voltage shift from an erase state to a write data state is used. Therefore, the threshold voltage range, which is permissible to the write data state, is so wide that it is permissible to write data with a relatively large voltage step.

By contrast to this, in case of a multi-level data storage scheme, for example, four-level data storage scheme, it is in need of writing three data states from an erase state. Therefore, a threshold voltage range assigned to a write data state becomes narrower. This leads to need of writing data in such a manner as to shift a data threshold voltage little by little with a small voltage step width. As a result, the number of write cycles becomes larger, and the write time becomes longer in comparison with those in the binary data storage scheme.

Further, a capacitive coupling noise between adjacent cells (especially between adjacent floating gates), which is increased in accordance with the design rule shrink, becomes a material cause for preventing the flash memory from being writable at a high speed. Specifically, in the four-level data storage scheme, it is in need of setting each gap between data threshold distributions to be narrower in comparison with that in the binary data storage scheme, so that the above-described capacitive coupling noise strongly influences on the write speed. To reduce the influence of the capacitive coupling, it is required in general to make the write voltage step small.

There have already been provided various write speed-up techniques in the conventional flash memories, specifically ones with a multi-level data storage scheme, one of which is, for example, as follows: data write is performed with a large voltage step until a certain verify-level, which is set to be a little lower than a target write threshold voltage, and thereafter performed with a reduced amount of the threshold voltage shift, thereby substantially improving the write speed (for example, refer to Unexamined Japanese Patent Application Publication No. 2003-196988). To suppress the threshold voltage shift amount in the latter half of the write sequence, the bit line voltage is slightly raised so as to decrease the voltage difference between the word line and the channel of the memory cell.

Other techniques have been provided as follows: one technique is to improve the data write speed with such a write method as possible to reduce the influence on the data threshold voltage variation due to capacitive coupling between cells (for example, refer to Unexamined Japanese Patent Application Publication No. 2004-192789); and another technique is, for the purpose of making the data threshold voltage distribution narrow or shortening the write time, to measure the memory cells' threshold voltages before or after the initial write signal, and determine the following write conditions based on the measured result (for example, refer to Unexamined Japanese Patent Application Publication No. 2000-113686).

SUMMARY OF THE INVENTION

According to an aspect of the present invention, there is provided a non-volatile semiconductor device including: a memory cell array having electrically rewritable and non-volatile semiconductor memory cells arranged therein; and a sense amplifier circuit configured to read data of and hold data to be written into the memory cell array, the device being internally controlled to execute a write sequence with write pulse applications and write-verify operations repeated for writing a set of memory cells selected in the memory cell array, wherein the sense amplifier circuit performs a write speed verify operation for detecting write speed of plural memory cells to be written into a certain data state after a certain write pulse application at the beginning of the write sequence, thereby getting discriminating data for classifying the plural memory cells into first and second cell groups, the write speed of the memory cell in the second cell group being lower than that in the first cell group, and wherein after the write speed verify operation, the first and second cell groups are alternately written on different write conditions from each other with reference to the discriminating data.

According to another aspect of the present invention, there is provided a method of writing data into plural memory cells in a non-volatile semiconductor memory device with write pulse applications and write-verify operations repeated, including:

performing a write speed verify operation for detecting write speed of plural memory cells to be written into a certain data state after a certain write pulse application at the beginning of a write sequence, thereby getting discriminating data for classifying the plural memory cells into first and second cell groups, the write speed of the memory cell in the second cell group being lower than that in the first cell group; and alternately writing the first and second cell groups on different write conditions from each other with reference to the discriminating data after the write speed verify operation.

BRIEF DESCRIPTION OF THE DRAWINGS

FIG. 28 shows the internal configuration of the digital still camera.

DETAILED DESCRIPTION OF THE EMBODIMENTS

Illustrative embodiments of this invention will be explained with reference to the accompanying drawings below.

Adapt the conventionally proposed speedup techniques to a currently used flash memory, and the speedup effect will be diluted in such a case that there is a large write speed variation among plural memory cells, which are simultaneously written or programmed, thereby increasing write (or program) cycle numbers. Specifically, in case a floating gate type of memory cells are used, the variation of the capacitive coupling ratio of each control gate and floating gate leads to write speed difference.

In the embodiments described below, a "write speed verify" operation is performed for memory cells to be written into a certain data state after a certain write pulse application so as to get "discriminating data" or index data of the write speed, and thereafter memory cell groups with different write speeds from each other are alternately applied with suitable write pulses, respectively, with reference to the discriminating data.

Embodiment 1

Figure 1:
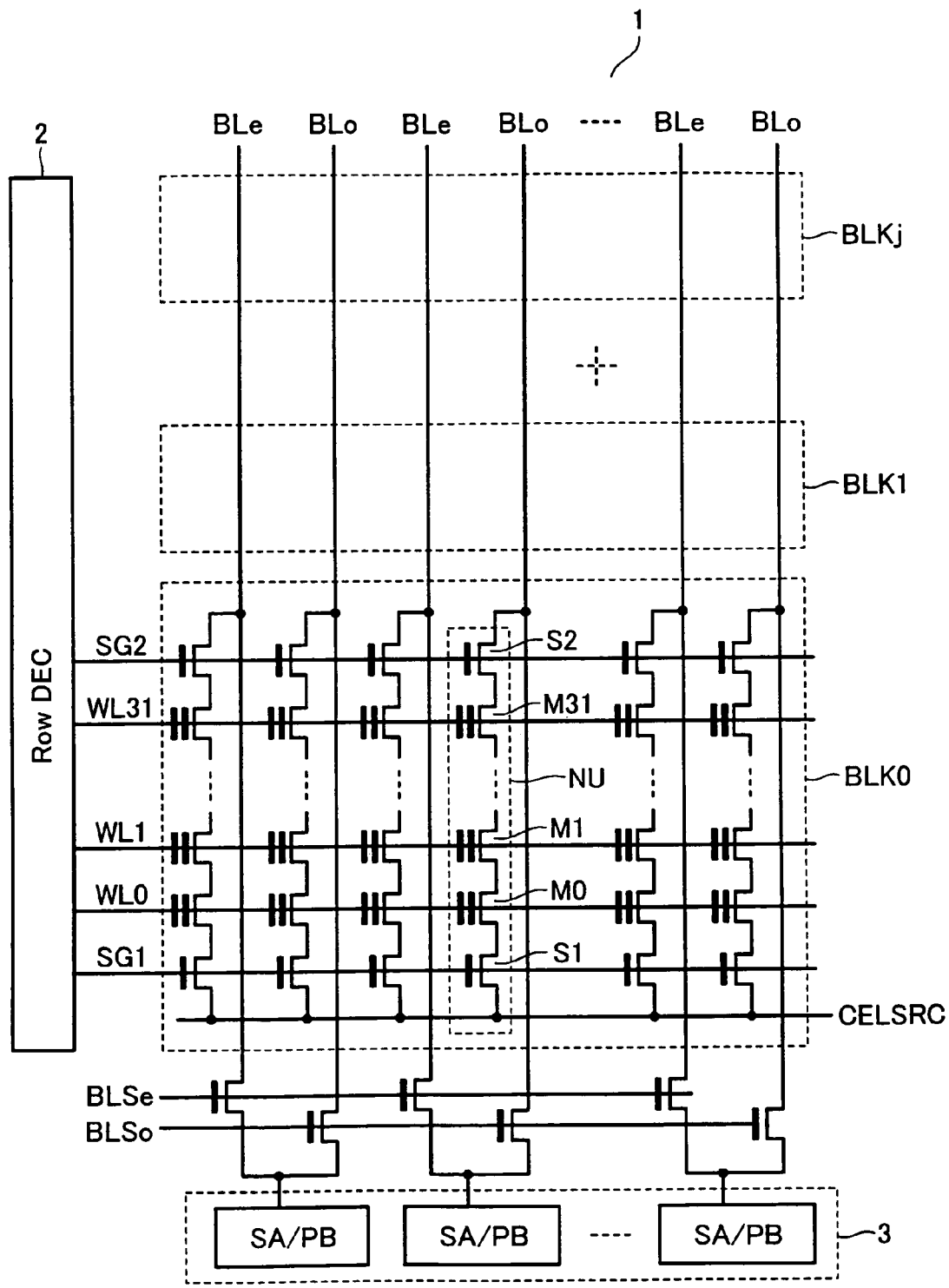
FIG. 1 is a diagram for showing a memory core configuration of a NAND-type flash memory in accordance with an embodiment of the present invention.

FIG. 1 shows an equivalent circuit configuration of a memory core circuit of a NAND-type flash memory in accordance with an embodiment. The memory cell array 1 is formed of NAND cell units NU arranged therein. Each NAND cell unit NU is constituted by a NAND string with plural, thirty-two for instance, memory cells M0-M31 connected in series and select gate transistors S1 and S2 disposed for coupling the both ends of the NAND string to a source line CELSRC and a bit line BLe (or BLo), respectively.

Control gates of the memory cells M0-M31 are connected to word lines WL0-WL31, respectively; and gates of the select gate transistors S1 and S2 to select gate lines S1 and S2, respectively.

A set of NAND cell units NU sharing the word lines WL0-WL3 is defined as a "block", which serves as a unit of data erase. As shown in FIG. 1, plural blocks BLK0, BLK1, ..., BLKj are arranged in the direction of the bit line.

Disposed for block and word line selection is a row decoder 2. This row decoder 2 includes block decoders for selecting blocks and drivers for supplying drive voltages to thirty two word lines and two select gate lines in a selected block.

A sense amplifier circuit 3 is disposed to be coupled to bit lines of the memory cell array 1 for reading data of and writing or programming data into it. The sense amplifier circuit 3 includes one page sense units SA/PB arranged therein, each of which serves as a sense amplifier and a page buffer.

In this embodiment, each sense unit SA/PB is shared by an even numbered bit line BLe and an odd numbered bit line BLo disposed adjacent thereto. This is a result of considering that it is difficult to dispose a sense unit for every bit line pitch as a result of miniaturization of the memory cell array 1; and the capacitive coupling between adjacent bit lines is increased due to the same reason. Even bit line BLe and odd bit line BLo are used in such a way that when one of them is selected, the other is used as a shield line. By use of such the scheme, it becomes possible to reduce the influence of capacitive coupling noise between bit lines.

In the flash memory in accordance with this embodiment, a set of memory cells selected by a word line and the entire even numbered bit lines serves as a first page (even page); and a set of memory cells selected by a word line and the entire ode numbered bit lines as a second page (odd page). Each page serves as a unit of data read or write, the entire memory cells of which are simultaneously read out or written.

Figure 2:
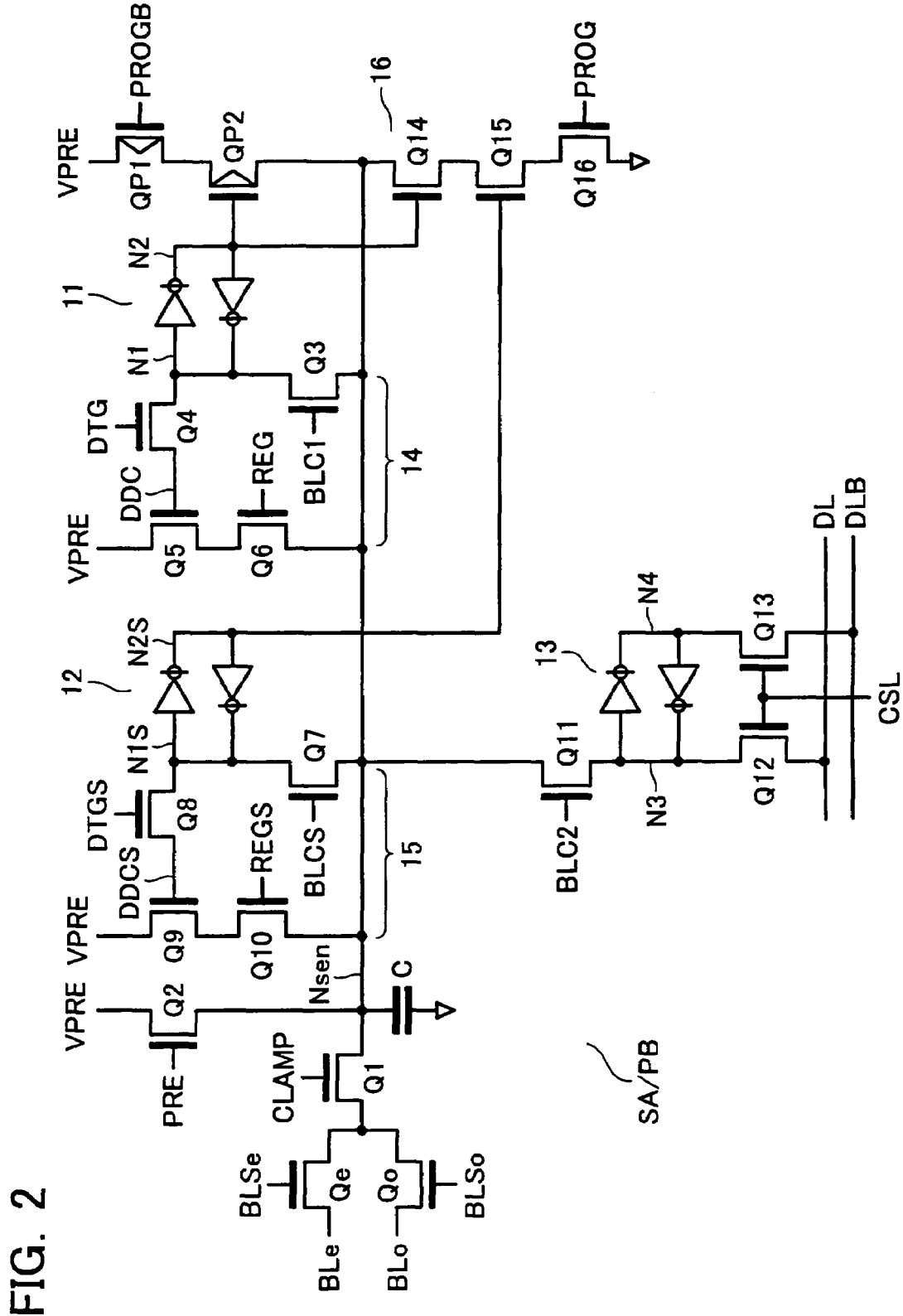
FIG. 2 is a diagram for showing a sense unit (SA/PB) configuration of the flash memory.

FIG. 2 shows a configuration example of the sense unit SA/PB. The sense node Nsen is selectively coupled to bit lines BLe and BLo via a clamping NMOS transistor Q1 and even/odd bit line electing NMOS transistors Qe and Qo. The clamping transistor Q1 serves for clamping the bit line voltage and serves as a pre-sense amplifier for sensing bit line data. A precharging NMOS transistor Q2 for precharging the bit line and a charge storage capacitor C are coupled to the sense node Nsen.

Data latches 11, 12 and 13 are parallel-connected to the sense node Nsen via transferring NMOS transistors Q3, Q7 and Q11, respectively. Each of these data latches 11, 12 and 13 is formed with clocked inverters.

Data latch 11 is a main data storage circuit used for reading and writing data. Disposed between the data node N1 of this data latch 11 and the sense node Nsen is a data write-back circuit 14, which includes a data storage node DDC for temporarily holding write data.

A data transferring NMOS transistor Q4 is disposed between the gate of MNOS transistor Q5 serving as the data storage node DDC and the data node N1. A write-back NMOS transistor Q6 is disposed between the transistor Q5 and the sense node Nsen for determining write data of the next cycle in accordance with data stored at the data storage node DDC.

Data latch 13 is prepared for receiving/transmitting data from/to the external. For this purpose, data nodes N3 and N4 thereof are coupled to data lines DL and DLB via column select gate transistors Q12 and Q13, respectively.

Another data latch 12 is prepared for holding write data transferred at the beginning of a write sequence, and thereafter holding discriminating data or index data, which classifies memory cells to be written into a certain data state in a selected page in accordance with data write speed thereof. Disposed between the data node N1S of the data latch 12 and the sense node Nsen is a write speed switching circuit 15, which includes a data storage node DDCS for temporarily storing write data.

The write speed switching circuit 15 serves, as described later in detail, for alternating the write operation (i.e., switching the bit line control voltage) between first and second cell groups, write speed in the first cell group being higher than that in the second cell group. The configuration of the speed switching circuit 15 is the same as the write-back circuit 14. That is, a data transferring NMOS transistor Q8 is disposed between the gate of MNOS transistor Q9 serving as the data storage node DDCS and the data node N1S. A write-back NMOS transistor Q10 is disposed between the transistor Q9 and the sense node Nsen for determining write data of the next cycle in accordance with data stored at the data storage node DDCS.

A bit line driver circuit 16 is disposed for generating a bit line controlling voltage in accordance with data states of the data latches 11 and 12 at a write time. The bit line drive circuit 16 has activating PMOS transistor QP1 and NMOS transistor Q16, which are driven by complementary timing signals PROGB and PROG, respectively, to be simultaneously turned on or off. Disposed between these activating transistors QP1 and Q16, PMOS transistor QP2 and NMOS transistor Q14, the common gate of which are driven by the data node N2 of data latch 11, and NMOS transistor Q15, the gate of which is driven by the data node N2S of data latch 12, are connected in series.

Figure 3:
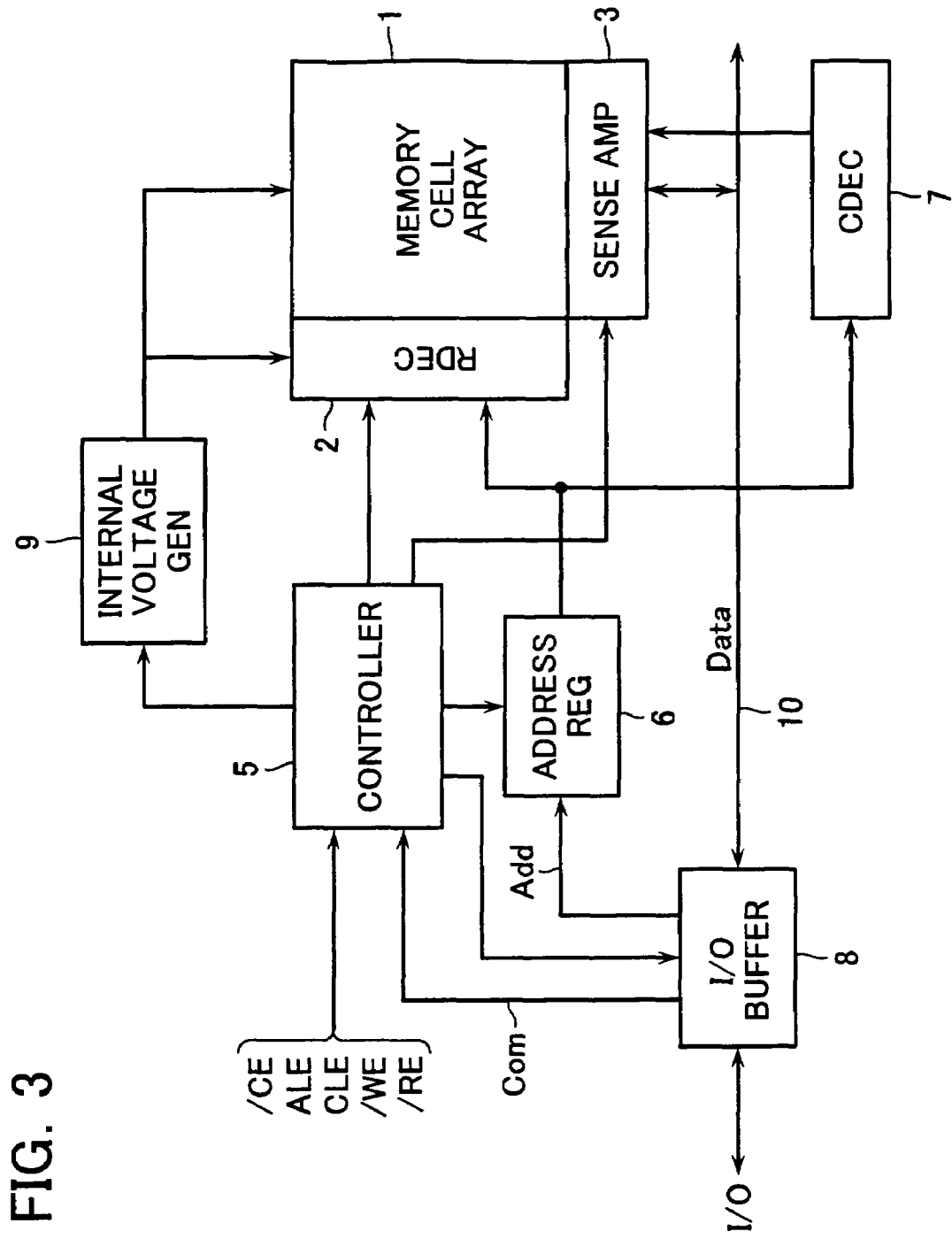
FIG. 3 is a diagram for showing a functional block of the flash memory.

FIG. 3 shows a functional block configuration of the NAND-type flash memory in accordance with this embodiment. Data transmitting/receiving is performed via a data bus 10 and a data buffer 8 under the control of a column decoder 7.

An internal control circuit (i.e., controller) 5 is supplied with various external control signals such as chip enable signal /CE, address latch enable signal ALE, command latch enable signal CLE, write enable signal /WE, read enable signal /RE and the like. Based on these control signals, the controller 5 distinguishes an address data "Add" from a command "Com", and transfers the address data to the row decoder 2 and column decoder 7 via an address register 6. The command will be decoded in the controller 5.

Controller 5 controls a data read operation and data write and erase sequences in response to the command data and external control signals. To generate internal voltages (i.e., voltages boosted from power supply voltage) necessary for operation modes, an internal voltage generating circuit 9 is disposed. This internal voltage generating circuit 9 is operable under the control of the controller 5 to do boost-operation for outputting necessary voltages.

Figure 4:
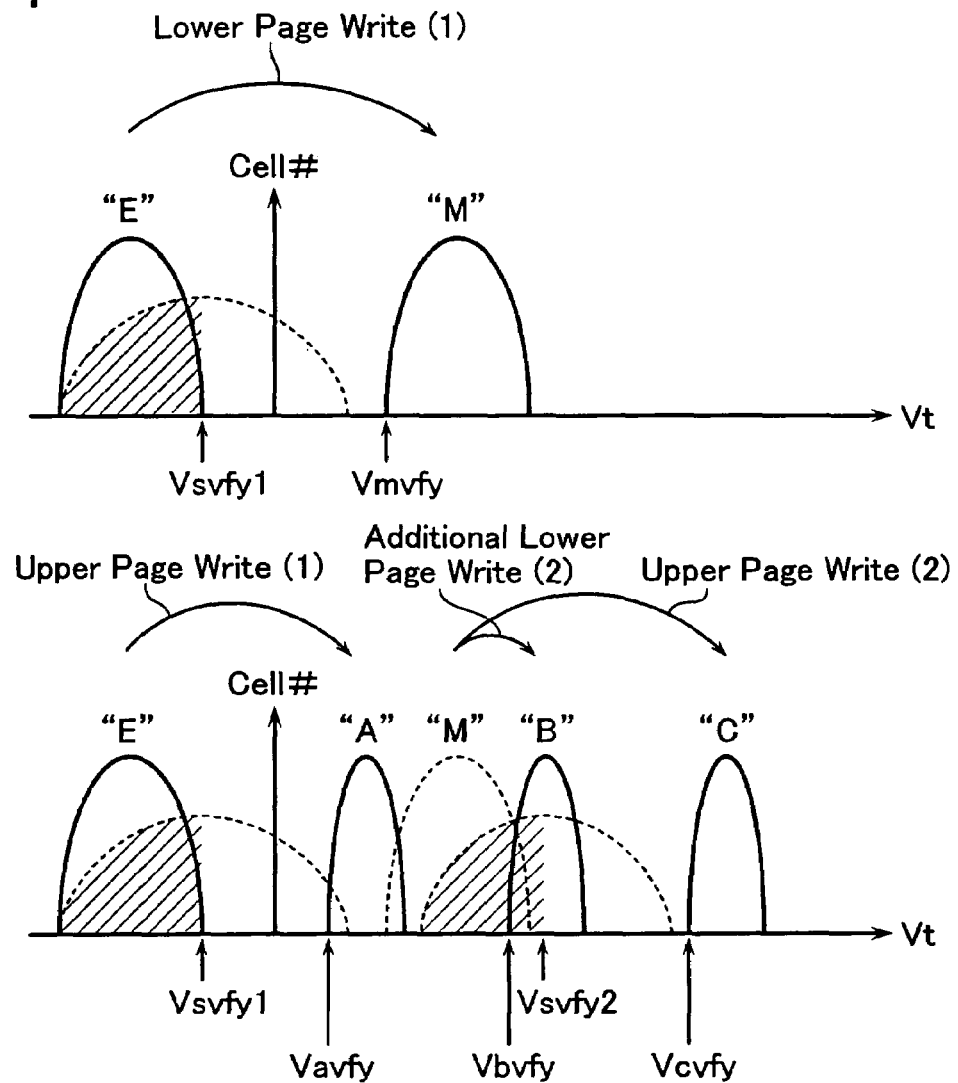
FIG. 4 is a diagram for explaining a four-level data write method of the flash memory.

FIG. 4 shows data threshold distributions and writing method thereof. Here, a four-level data storage scheme will be explained as an example of multi-level data storage schemes, in which one memory cell stores two bits. A four-level data is expressed as "xy" with a higher bit (or upper bit) "x" and a lower bit "y". According to the four-level data storage scheme, stored page numbers are twice as in a binary data storage scheme.

The lower column in FIG. 4 shows threshold distributions of an erase state "E" and three write states "A", "B" and "C" written from the erase state "E". For example, the erase state "E" is a negative threshold state, and write states "A", "B" and "C" are positive threshold states arranged in order of the threshold voltage. Data "11" is assigned to the erase state "E"; and data "01", "10" and "00" to the write state "A", "B" and "C", respectively.

The upper column in FIG. 4 shows a lower page write (1). This lower page write (1) is defined as such a coarse write operation as to obtain an intermediate data state "M" that is lower in threshold voltage than the desirable data state "B". In the lower column in FIG. 4, there are shown an upper page write (1) for writing data state "A" from erase state "E", another upper page write (2) for writing data state "C" from data state "M", and an additional lower page write (2) for writing data state "B" from data state "M".

The lower page write (1) is performed by repeat of a write pulse application operation for a selected word line and a write-verify operation for verifying the write state. The write-verify operation is performed as a read operation, in which verify voltage Vmvfy corresponding to the lowest value of the threshold voltage to be written is applied to the selected word line.

With respect to the upper page write (1), (2) and the additional lower page write (2), a common write pulse application operation is performed, and write-verify operations are performed independently for the upper page write (1), (2) and the additional lower page write (2) with verify voltages Vavfy, Vbvfy and Vcvfy, respectively.

Figure 6:
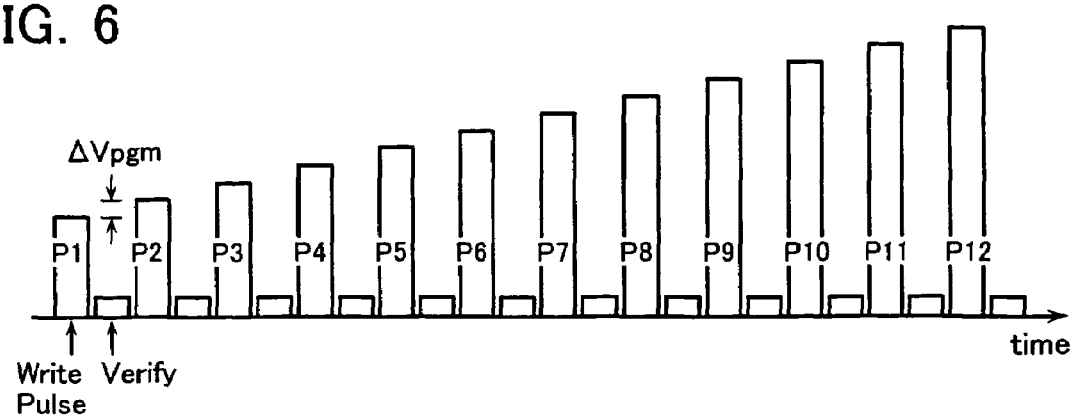
FIG. 6 is a diagram for showing a conventional write pulse application operation usually used in the four-level data write shown in FIG. 4.

In a conventional write operation example, as shown in FIG. 6 with giving attention to the lower page write (1), write voltage is stepped up by a certain voltage step ($\Delta$Vpgm) as the write cycle increment. The initial write pulse P1 is selected in voltage in such a manner that a memory cell with the highest write speed within simultaneously written memory cells is not shifted in voltage over a range of a desirable threshold distribution. If the initial value of the write pulses is too high, the memory cell will be over-programmed, thereby resulting in that data thereof becomes erroneous, or destroys data of the remaining cells in the NAND cell unit.

In FIG. 6, suppose that data write is completed with application of write pulse P10. Write-finish or write-completion judgment is performed after the verify-read in such a way as to detect that the entire "0" write data in the sense amplifier have been renewed as "1" data.

Figure 7:
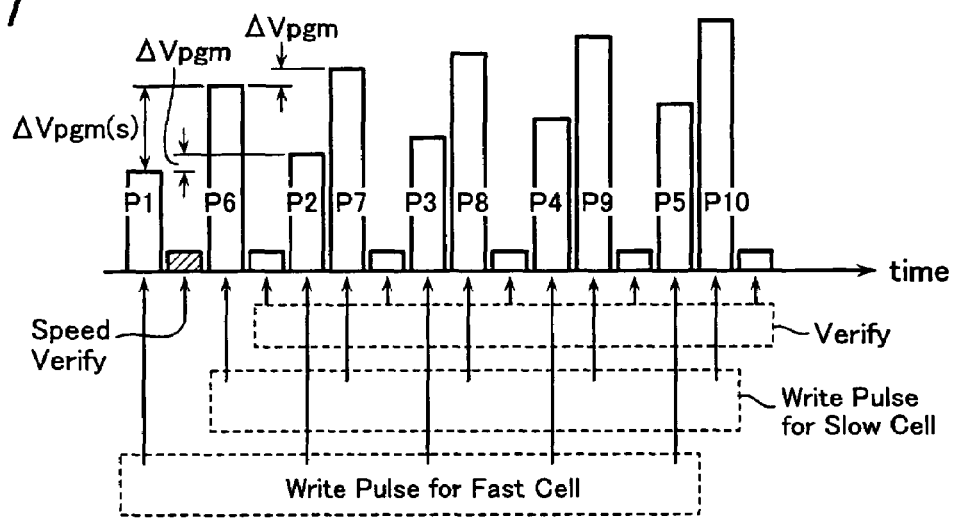
FIG. 7 is a diagram for showing a write pulse application operation in this embodiment in comparison that shown in FIG. 6.

FIG. 7 shows a write pulse application state in accordance with this embodiment in comparison with FIG. 6. In this embodiment, after having applied the initial write pulse P1, "write speed verify" (or simply refer to as "speed verify") is performed for detecting a threshold voltage shift state of memory cells to be written into data "M" state (i.e., memory cells, into which "0" data is written simultaneously) so as to judge the write speed thereof.

A threshold voltage distribution, which is shown by a dotted line at the upper column in FIG. 4, shows that at the midway of data write from erase state "E" to data state "M". A memory cell with a high write speed can be shifted in threshold voltage from that of the erase state "E" to near to that of data "M", while another memory cell with a low write speed is hardly shifted in threshold voltage and kept in the threshold distribution of the erase state "E".

When data read operation (i.e., write speed verify operation) is performed with a judgment level of Vsvfy1, which corresponds to the center of the supposed threshold distribution shown by the dotted line in FIG. 4, first and second cell groups are classified as follows: memory cells in the first cell group are shifted in threshold voltage as higher than the verify voltage Vsvfy1 (i.e., data thereof are read out as "0"); and memory cells in the second cell group are kept in threshold voltage as lower than Vsvfy1 as being hatched (i.e., data thereof are read out as "1"). It is noticed that the memory cells in the first cell group have a relatively higher write speed than that in the second cell group.

In the description as described below, the memory cells in the above-described first and second cell groups will be referred to as "fast cell(s)" and "slow cell(s)", respectively. As explained above, fast and slow cells are read as "0" and "1" cells, respectively, in the read operation with the verify voltage Vsvfy1, so that the read data serve as discriminating data for discriminating between fast cells and slow cells.

The write speed-verify operation described above is preformed in the sense unit SA/PB. That is, the sense unit SA/PB performs such the speed verify to get write speed discriminating data for memory cells to be written into a certain data state in a page. After the write speed verify, write pulse application conditions are set different from each other between fast cells and slow cells in accordance with the discriminating data held in the sense unit SA/PB so that data write of the fast and slow cells are progressed about simultaneously.

That is, as shown in FIG. 7, write pulse P6, which is largely stepped up from the initial write pulse P1, is followed after the initial pulse P1 based on the write speed verify, whereby "0" write is performed for slow cells. At this time, fast cells will be kept in a write inhibiting state (i.e., "1" write state). The voltage step $\Delta$Vpgm(s) between the write pulses P1 and P6 is dependent on how high is the write speed level judged at the write speed verify. For example, supposing that the threshold distribution is shifted by 3V with one write pulse application; and the judge level of the speed verify is set at 1.5V under the uppermost threshold voltage (i.e., an average write speed position), $\Delta$Vpgm(s) is set to be 1.5V.

After the write pulse P6 application, a write-verify operation is performed to judge whether the memory cells have reached a threshold voltage state of an objective write level with the write pulse applications of P1 and P6 or not. Therefore, fast cells and slow cells are subjected to a common verify read operation under the same condition.

Next, unwritten fast cells are written with write pulse P2, following it unwritten slow cells are written with write pulse P7. The voltage step between pulses P1 and P2, and between pulses P6 and P7 is the same as the conventional one, $\Delta$Vpgm. Hereinafter, similar operations will be repeated.

Figure 9A:
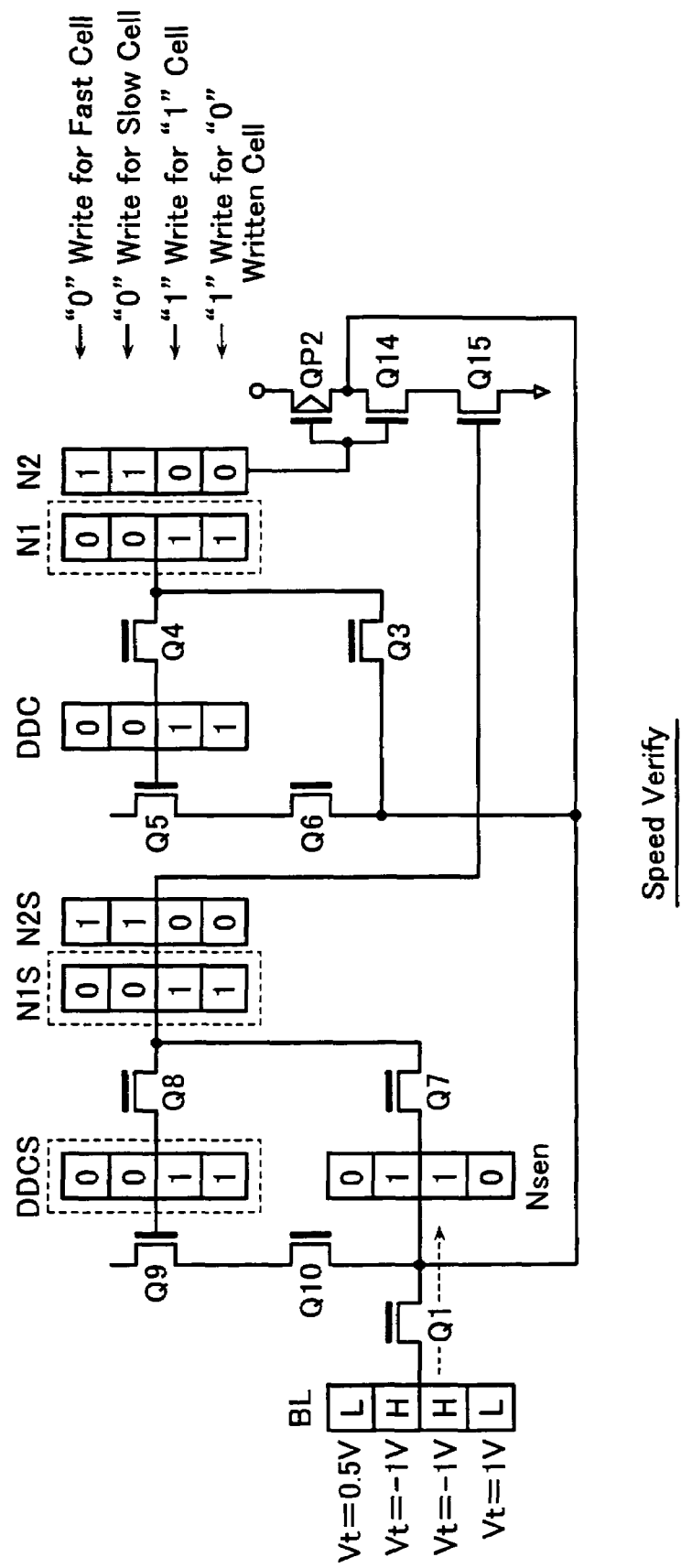
FIG. 9A is a diagram for showing data transition in the sense unit at the speed verify time in the embodiment.
Figure 9B:
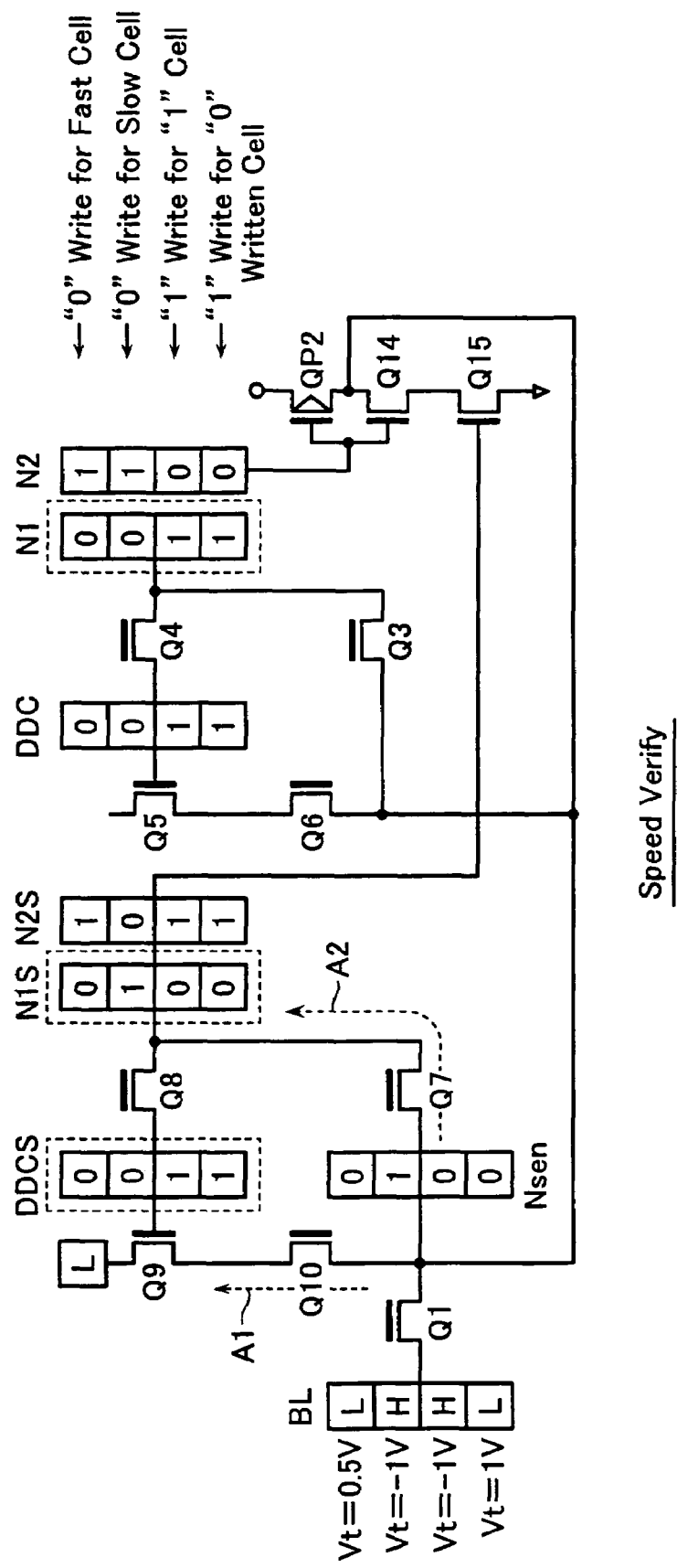
FIG. 9B is a diagram for showing data transition in the sense unit at the speed verify time.
Figure 9C:
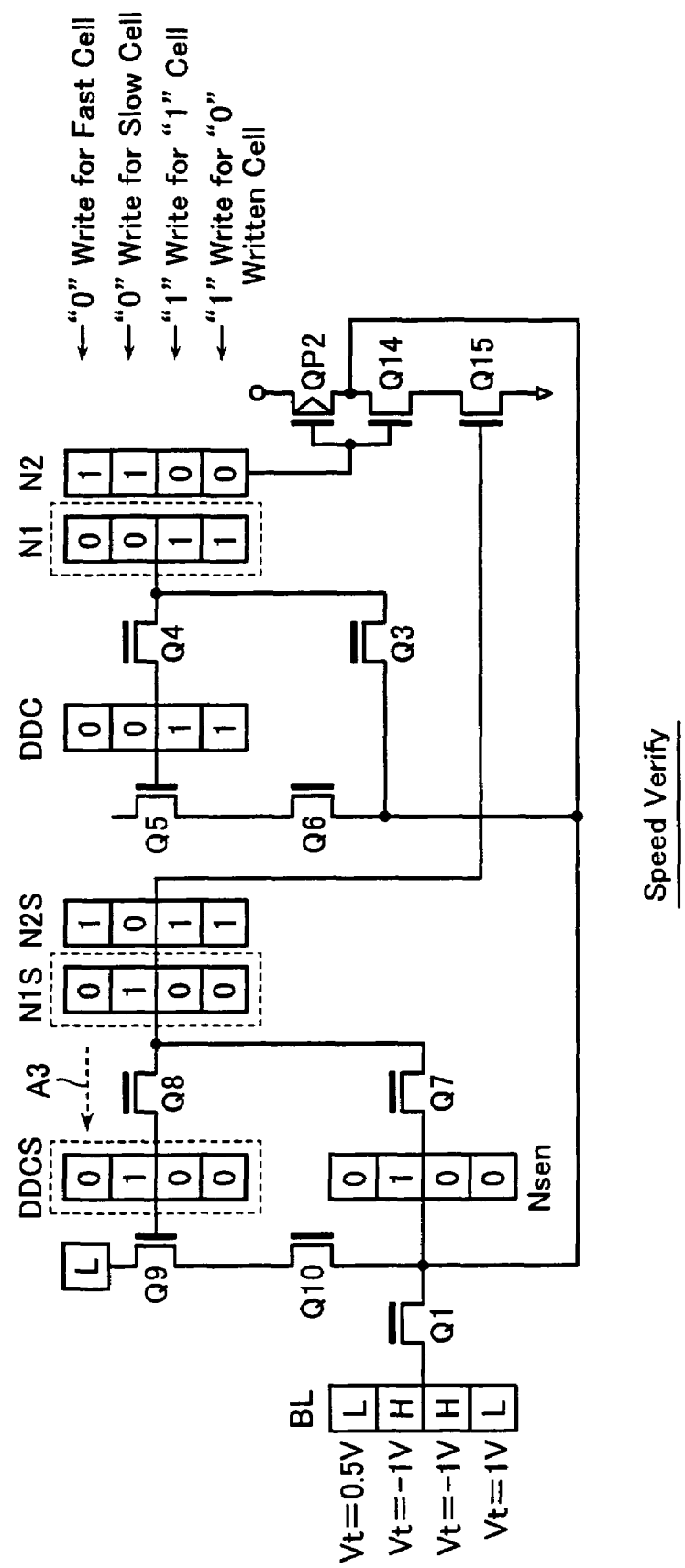
FIG. 9C is a diagram for showing data transition in the sense unit at the speed verify time.

Next, the speed verify-read operation will be explained in detail with reference to FIGS. 9A to 9C, which show data changes at main data nodes in the sense unit SA/PB. There is a high probability that no cells have been written into the "0" state just after the initial write pulse application shown in FIG. 7. Four data shown at the respective nodes in FIGS. 9A to 9C are those of the following four cases, Case(1) to (4), respectively: "0" write for a fast cell (Case(1)); "0" write for a slow cell (Case(2)); "1" write for an erased cell (Case(3)); and "1" write for a "0" written cell (Case(4)).

At the write data loading time, there is no distinction between Case(1) and Case(2). The initial write data is held at the nodes N1 and N2 of the data latch 11 as shown in FIG. 9A. The data at the node N1 is transferred to and held at the data storage node DDC. Further, the write data is transferred to and held at the data latch 12 (nodes N1S and N2S) and data storage node DDCS.

The write speed verify operation, which is performed after having applied the write pulse P1, is defined as a data read operation with the judging level Vsvfy1 corresponding to a negative threshold voltage as shown in FIG. 4. To read the negative threshold voltage of a memory cell, it is used, for example, a source follower operation, which is able to output an absolute value of the negative threshold voltage to a bit line, and it is subjected to data judgment.

Figure 13:
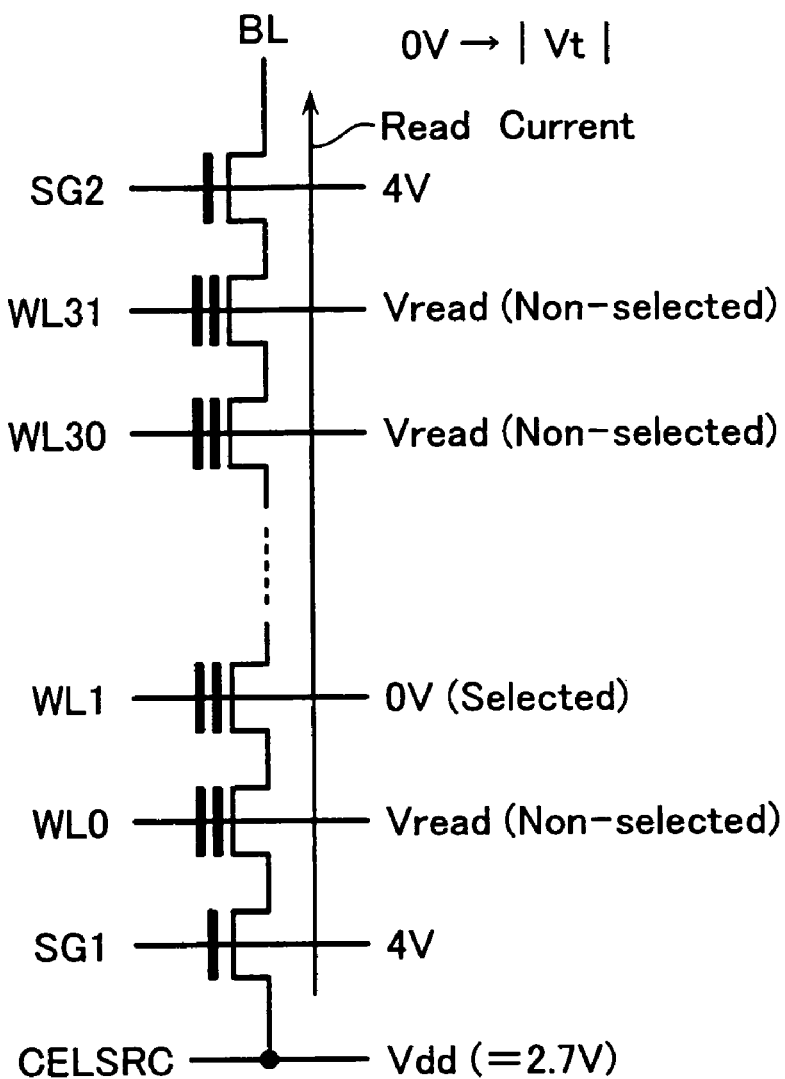
FIG. 13 is a diagram for showing the bias relationships in a source follower-connected NAND cell unit at the speed verify time.

FIG. 13 shows a bias condition of the above-described speed verify operation. A selected word line (WL1 in the example shown in FIG. 13) is applied with 0V; other non-selected word lines in the NAND cell unit are applied with a read pass voltage Vread (for example, about 5.5V), which is set to have no influences on data read of the selected memory cell; and the source line CELSRC is applied with Vdd (for example, 2.7V). After having discharged the bit line BL to be 0V, apply 4V to the select gate lines SG1 and SG2 to turn on the select gate transistors with the above-described voltage applications, and an absolute value of the negative threshold voltage of the selected memory cell, |Vt|, is generated on the bit line BL due to a cell current carried from the source line CELSRC to the bit line BL.

Supposing that write threshold voltages Vt of the above-described four cases after the write pulse P1 application are 0.5V, −1V, −1V and 1V, respectively, output data on the bit line BL are L(0V), H(~1V), H(~1V) and L(0V), respectively. Sense these bit line data with the clamping transistor Q1, the gate of which is applied with Vsvfy1+Vt (Vt; threshold voltage of the transistor Q1), and data "0", "1", "1" and "0" are read out at the sense node Nsen as shown in FIG. 9A.

That is, if the bit line voltage is higher than Vsvfy1, "1" data is read out, while if the bit line voltage lower than it, "0" data is read out. The former two data "0" and "1" in the four read out data serve as discriminating data, which designates fast and slow cells, respectively, within "0" write cells.

Next, apply a low level voltage (for example, Vss) to the drain node VPRE of the transistor Q9; and turn on the transfer transistor Q10, and the sense node Nsen is selectively discharged in accordance with data of the storage node DDCS (transferring operation A1). As a result, as shown in FIG. 9B, the data at the sense node Nsen will be rewritten to "0", "1", "0" and "0".

Further, the rewritten data at the sense node Nsen is transferred to and held in the data latch 12 via the transfer transistor Q7, which is turned on (transferring operation A2). The data held at the node N1S is, as shown in FIG. 9C, transferred to and held at the data storage node DDCS (transferring operation A3).

At this time, data stored at the nodes N1S and DDCS have been set in such a state that data corresponding to slow cells within "0" write cells to be shifted in threshold voltage in one page is "1". Although the write pulse P1, which has already been applied, is set at a value in consideration of the fast cells, the entire selected cells are subjected to write operation with the write pulse P1. Following it slow cell-use write pulse P6 is applied as shown in FIG. 7, and the write operation will be performed for only slow cells based on the discriminating data.

The data corresponding to a slow cell at the node N1S is "1" in the state shown in FIG. 9C. Therefore, to do "0" write with data held in the data latch 12, it is necessary to invert data in the data latch 12. In other words, it is in need of exchanging data between the nodes N1S and N2S. This may be regarded as discriminating data inverting, or write data inverting based on the discriminating data.

Figure 12A:
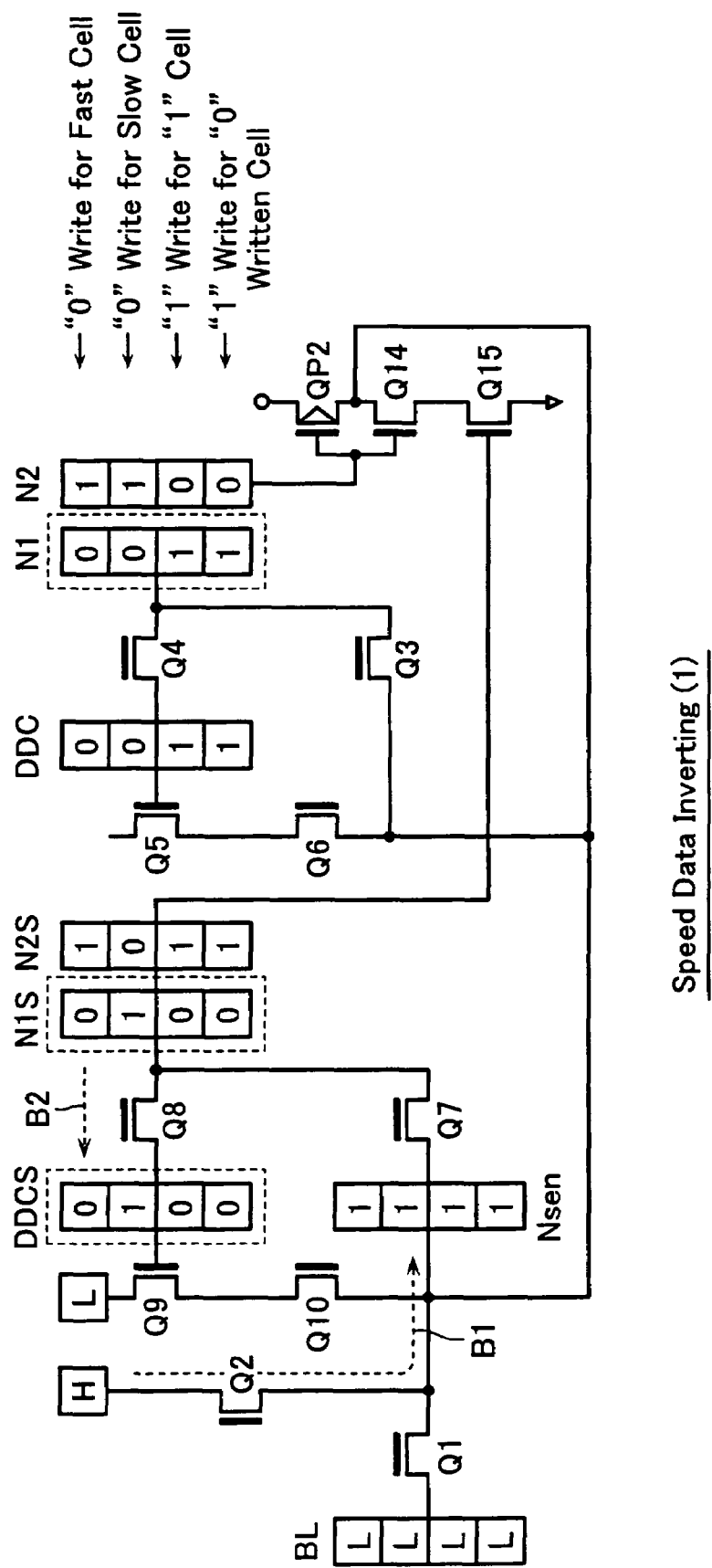
FIG. 12A is a diagram for explaining the data inverting operation of the speed discriminating data (sense node charging-up and data transferring) in the sense unit in the embodiment.

The data inverting operation of the speed discriminating data will be explained with reference to FIGS. 12A to 12C below. FIG. 12A shows the continuation of the data state shown in FIG. 9C. As shown in FIG. 12A, turn on the pre-charging transistor Q2 in a state where the drain is applied with a high level voltage (for example, Vdd), and the sense node Nsen is forcedly charged-up to a "H" level (charging operation B1). As a result, data of the sense node Nsen becomes "1" for every four case. Following it data at the node N1S is transferred to the node DDCS again as shown in FIG. 12A (transferring operation B2).

Figure 12B:
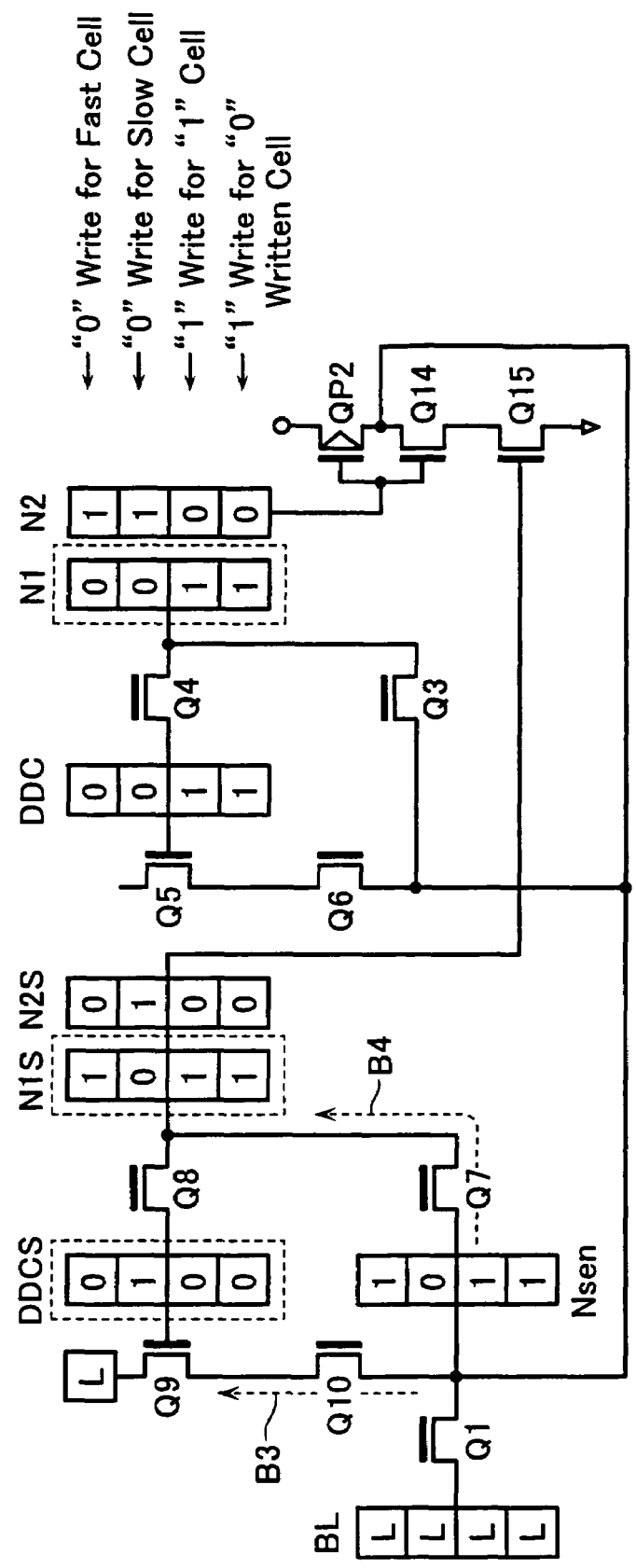
FIG. 12B is a diagram for explaining the data inverting operation of the speed discriminating data (sense node discharging and data transferring) in the sense unit in the embodiment.

Next, as shown in FIG. 12B, apply Vss(=1V) to the drain VPRE of the transistor Q9; and turn on the transistor Q10, and the sense node Nsen is selectively discharged in accordance with data held at the storage node DDCS (discharging operation B3). As a result, data at the sense node Nsen is set as "1", "0", "1" and "1" corresponding to the four cases (i.e., only data of "0" write case for slow cells, Case (2), becomes "0"), respectively. Data of the node Nsen is transferred to and held at the node N1S (transferring operation B4).

Figure 12C:
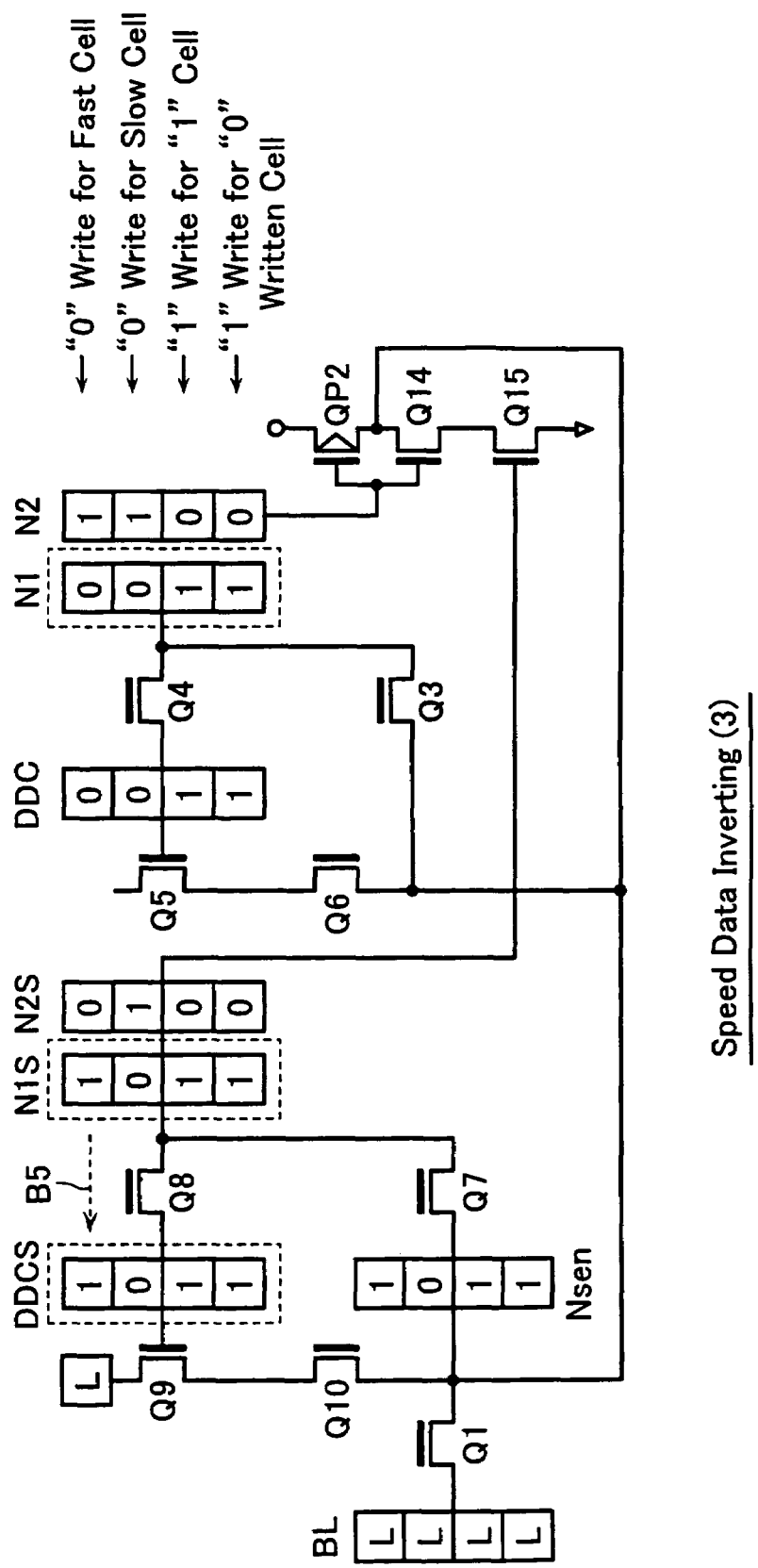
FIG. 12C is a diagram for explaining the data inverting operation of the speed discriminating data (data transferring) in the sense unit in the embodiment.

Next, as shown in FIG. 12C, data at the node N1S is transferred to the node DDCS (transferring operation B5). As a result, data at the nodes N1S and DDCS have been set in a state where only data of "0" write case for slow cells becomes "1", i.e., reversed to those shown in FIG. 12A.

After having set the data state at the nodes N1S and DDCS as described above, write pulse P6 is applied for performing "0" write for slow cells as shown in FIG. 7.

Figure 11A:
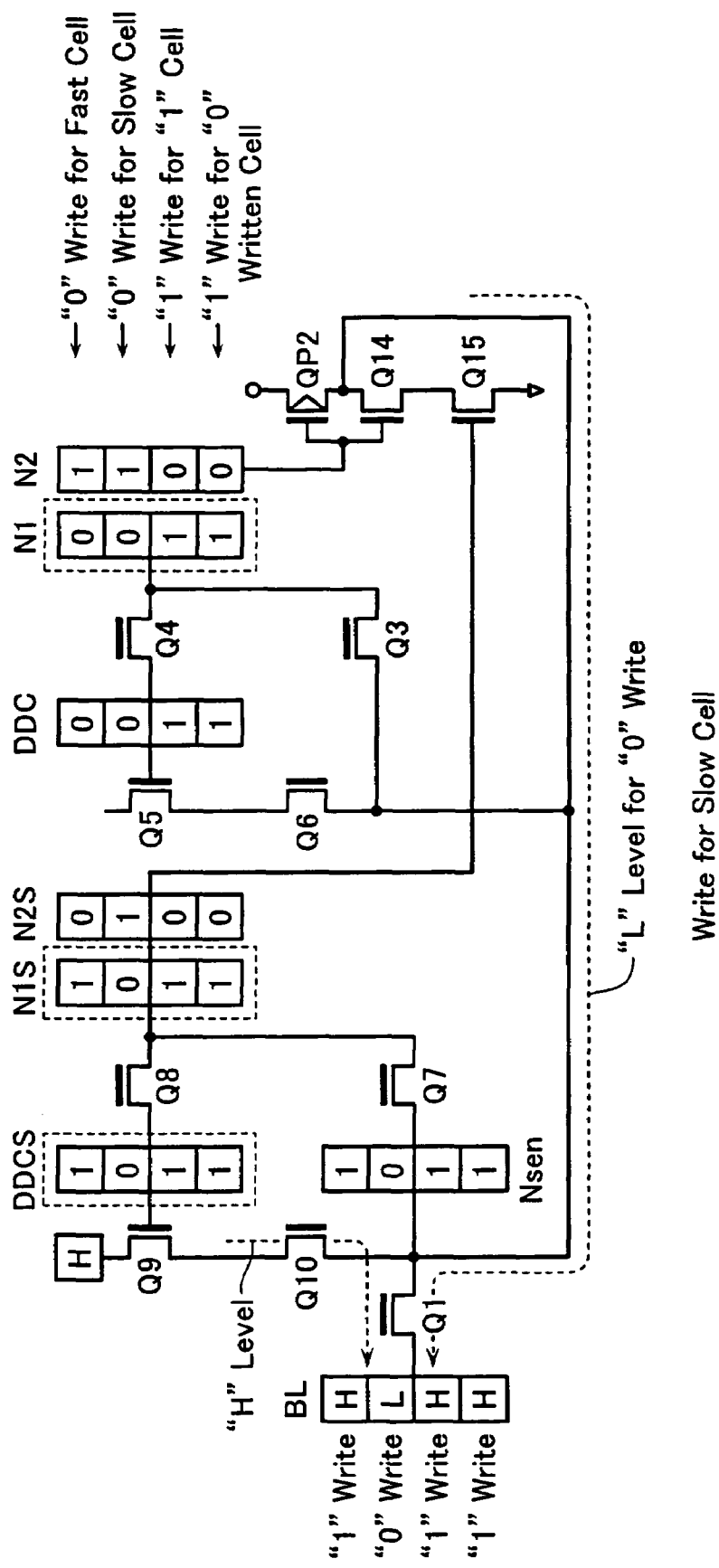
FIG. 11A is a diagram for showing a sense unit operation when slow cells are written in the embodiment.

FIG. 11A shows data states in the sense unit SA/PB at the slow cell writing time with the write pulse P6 application.

Prior to the write pulse application, NAND cell channels are applied with Vss and Vdd-Vt in accordance with write data "0" and "1", respectively, via the bit lines BL. The channel of the "1" write cell is charged-up to Vdd-Vt (Vt; threshold voltage of the select gate transistor) to be in a floating state, while the channel of the "0" write cell is set to be 0V via the select gate transistor kept on.

Therefore, when the write pulse is applied to a selected word line, a selective data writing is performed in such a way that electron injection into the floating gate occurs due to FN tunneling in a cell, to which "0" data is supplied (i.e., "0" write), while electron injection does not occur in another cell, to which "1" data is supplied (i.e., "1" write, or "0" write inhibiting).

In this example, based on the inversion of the speed discriminating data as described above, write data "1", "0", "1" and "1" are stored at the node N1S corresponding to the cases, Case(1), (2), (3) and (4), respectively. In case of data "1" at the node N1S, when the drain VPRE of transistor Q9 is applied with a "H" level (=Vdd); transistor Q10 is turned on; and the clamping transistor Q1 is turned on, a "H" level voltage is applied to the bit line via transistors Q9 and Q19 (i.e., via the write seed switching circuit 15).

That is, in Case(3) and Case(4), which are originally "1" write cases, and in Case(1), which is originally a "0" write case, and set as a "1" write case (i.e., write inhibiting) at this time because the write speed has been judged to be fast, the corresponding NAND cell channels are applied with Vdd.

A "L" level used for "0" writing to the slow cell is applied via the bit line driving circuit 16. Since data at the node N2 of the data latch 11 are "1", "1", "0" and "0", the bit line driver circuit 16 is driven in such a way that transistor QP2 is off while transistor Q14 is on in "0" write Case(1) and Case(2). Additionally connected to the bit line driver circuit 15 is a transistor Q15, the gate of which is controlled with the data at the node N2S of the data latch 12. In the data states shown in FIG. 11A, node N2S="1" for a "0" write slow cell, and it turns on transistor Q15. Therefore, with respect to only "0" write slow cell, the bit line driver circuit 15 applies a low level voltage to the bit line.

As described above, "0" write data are output to only the bit lines corresponding to the slow cells. Following it slow cell write-use write pulse P6 is applied as described above, and then write-verify is performed. This write-verify is for judging whether the cell threshold voltages have reached a target write level or not, and fast cells and slow cells are subjected to this write-verify simultaneously.

Figure 10A:
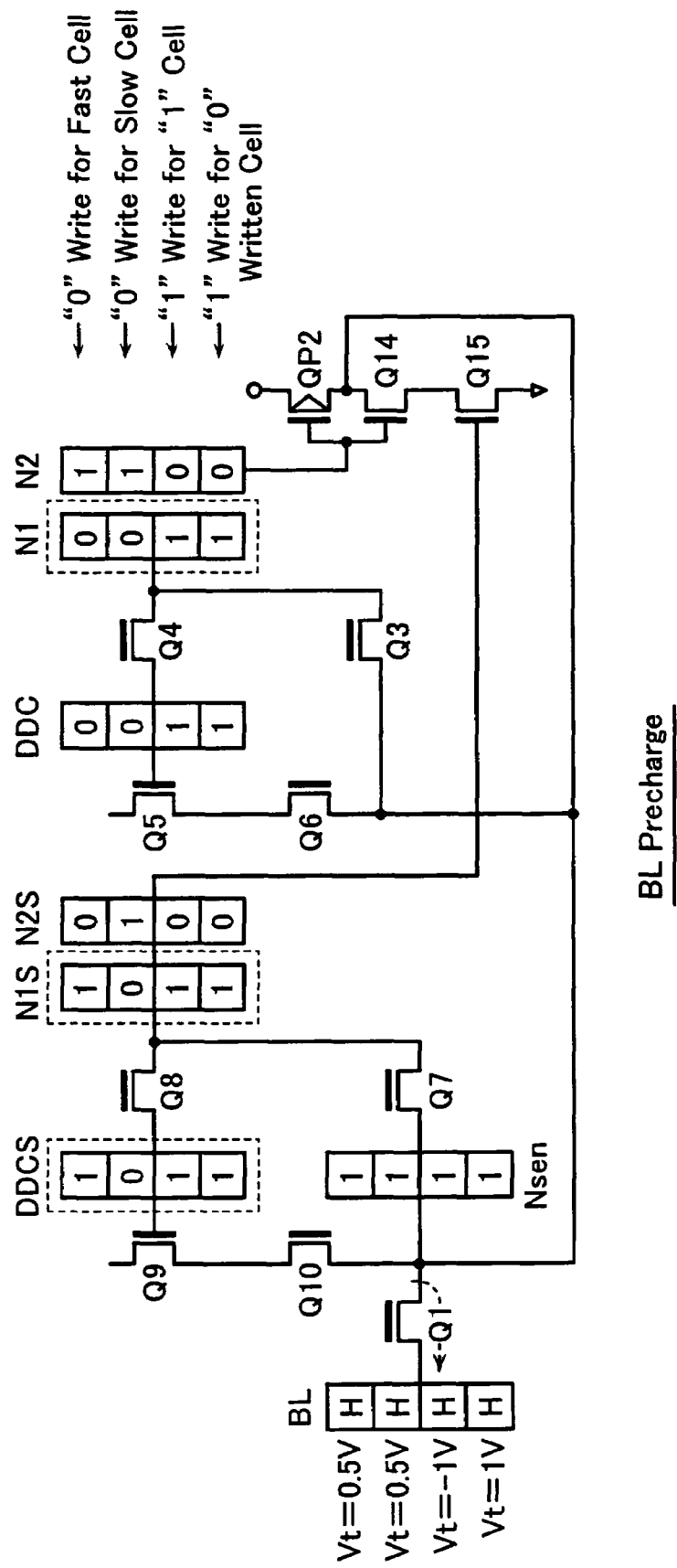
FIG. 10A is a diagram for showing data transition in the sense unit at the write-verify time (bit line precharge time) in the embodiment.
Figure 10B:
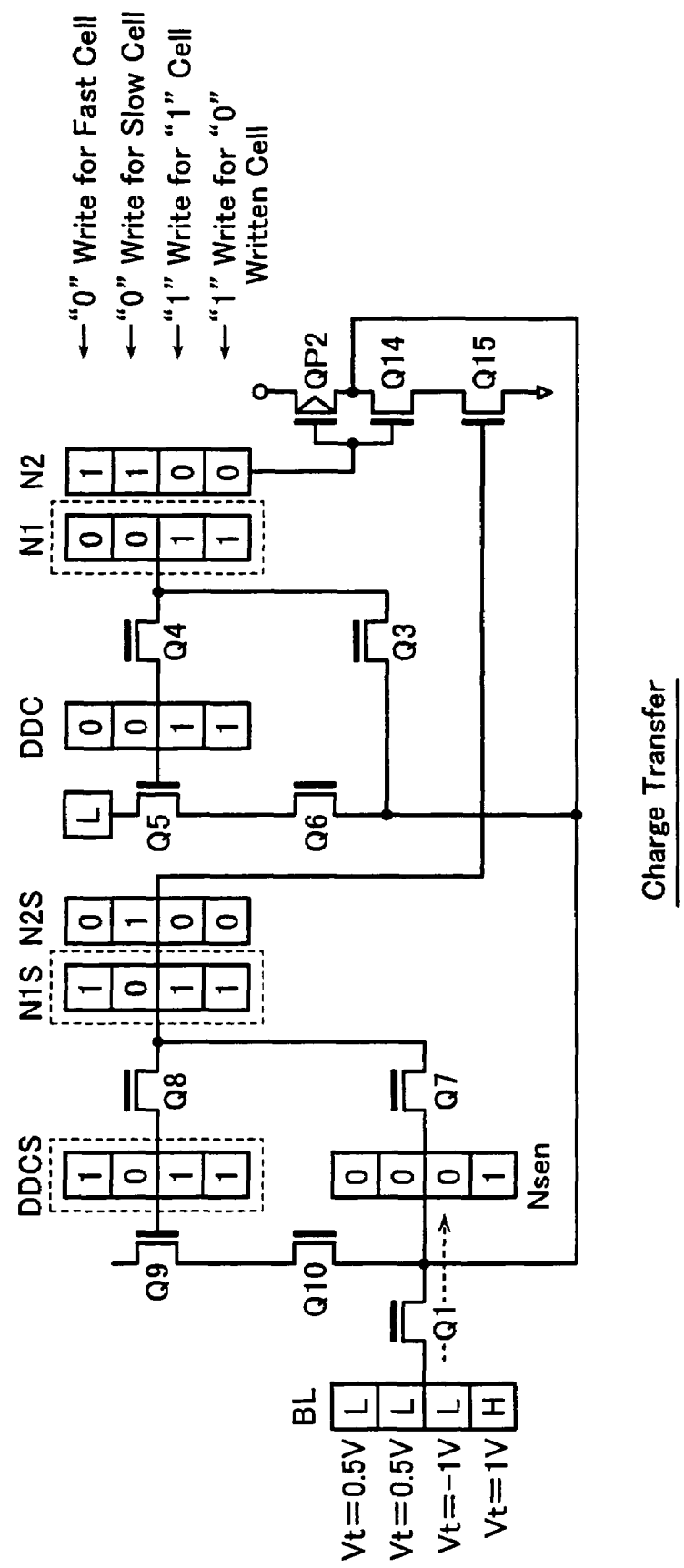
FIG. 10B is a diagram for showing data transition in the sense unit at the write-verify time (bit line data sensing time).

The write-verify operation will be explained with reference to FIGS. 10A to 10E, which show data changes in the sense unit SA/PB, below. As shown in FIG. 4, to verify the data state "M", verify voltage Vmvfy is used, which is set at the lowest value of the data threshold voltage. As shown in FIG. 10A, the bit line is precharged to a certain voltage level under the condition that the verify voltage Vmvfy (for example, 1V) is applied to a selected word line; pass voltage Vread to non-selected word lines, which turns on a cell without regard to cell data; 4V to the bit line side select gate line SG2; and 0V to the source line side select gate line SG1. This bit line precharge is performed with the precharging transistor Q2 and clamping transistor Q1 turned on.

Next, applying 4V to the source line select gate line SG1, the bit lines are selectively discharged via the selected cells. Supposing that the memory cell threshold voltages are 0.5V (insufficient "0" write), 0.5V (insufficient "0" write), −1V ("1" write) and 2V ("0" write completion) corresponding to the four Cases(1), (2), (3) and (4), respectively, the bit line will be discharged, discharged, discharged and non-discharged, respectively. This bit line voltage is sensed by use of charge distribution between the bit line BL and sense node Nsen, to output data at the sense node Nsen as being "L" (="0"), "L", "L" and "H" (="1") in Case(1) to (4), respectively.

Figure 10C:
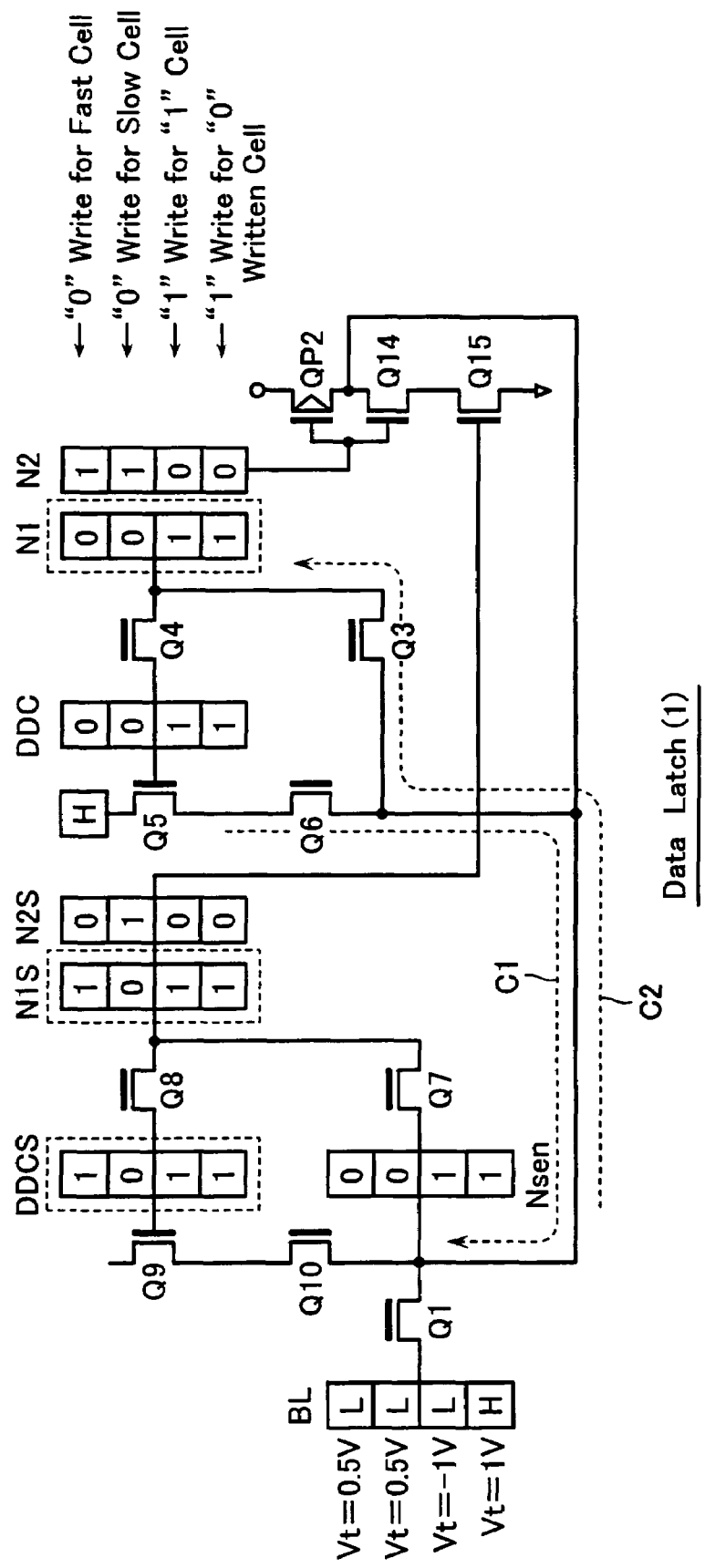
FIG. 10C is a diagram for showing data transition in the sense unit at the write-verify time (data transferring time).

To perform data write again, as shown in FIG. 10C, the write data is processed with the write back circuit 14 as follows. Since the third and fourth cases, Case(3) and Case (4), are "1" write ones, it is in need of continuing "1" write in spite of the result of the verify-read. Write data is held at the node DDC. Therefore, applying a "H" level voltage to the drain of transistor Q5, and turning on transistor Q6, the sense node Nsen is charged in accordance with data at the node DDC (transferring operation C1).

As a result, with respect to Case(3) and Case(4), the sense node Nsen is forcedly set in a "1" data state. Following it data at the sense node Nsen is transferred to the data latch 11 (transferring operation C2).

In the example shown in FIG. 10c, threshold voltages of two "0" write cells have not yet reached the verify voltage Vmvfy. Therefore, the same data as those before the write-verify are restored in the data latch 11.

Figure 10D:
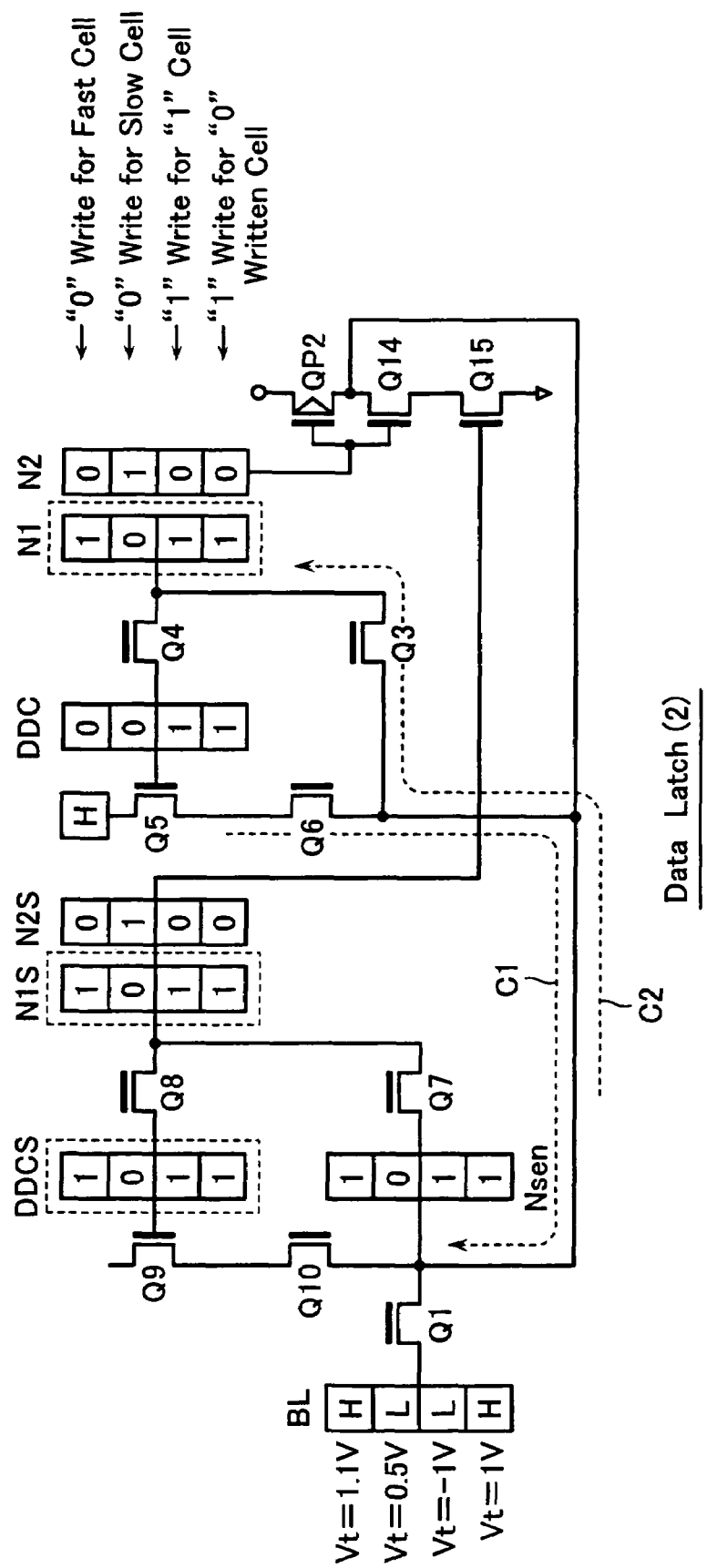
FIG. 10D is a diagram for showing data transition in another data state in comparison with that shown in FIG. 10C.

By contrast to the example shown in FIG. 10c, FIG. 10D shows a data state where one "0" write cell has been written to have a threshold voltage higher than the verify voltage Vmvfy. The example shown in FIG. 10D is on the assumption that the threshold voltage of a fast cell of "0" write case, Case(1), is 1.1V (sufficiently written). In this case, as a result of the bit line sensing, Nsen="H" (="1") may be obtained.

In this case, the same transferring operation C1 as shown in FIG. 11C causes that "1" write data is restored at the sense node Nsen for Case(3) and Case(4); and the transferring operation C2 causes that data at the sense node Nsen is restored in the data latch 11.

Next, in accordance with the data renewed based on the verify result, the successive data write (i.e., write pulse applications of P2 and P7 as shown in FIG. 7) are performed. Note here that the next data write is for fast cells. Therefore, prior to this data write, the discriminating data held in the data latch 12 will be set to designate that the write mode is for the fast cells with the write speed switching circuit 15. In detail, the speed discriminating data is inverted as explained with reference to FIGS. 12A to 12C. As a result, the sense unit is set in such the data state shown in FIG. 12A that the data node DDCS is "0" with respect to "0" write fast cell and "1" write cell (initially selected as "1" write cell).

Figure 11B:
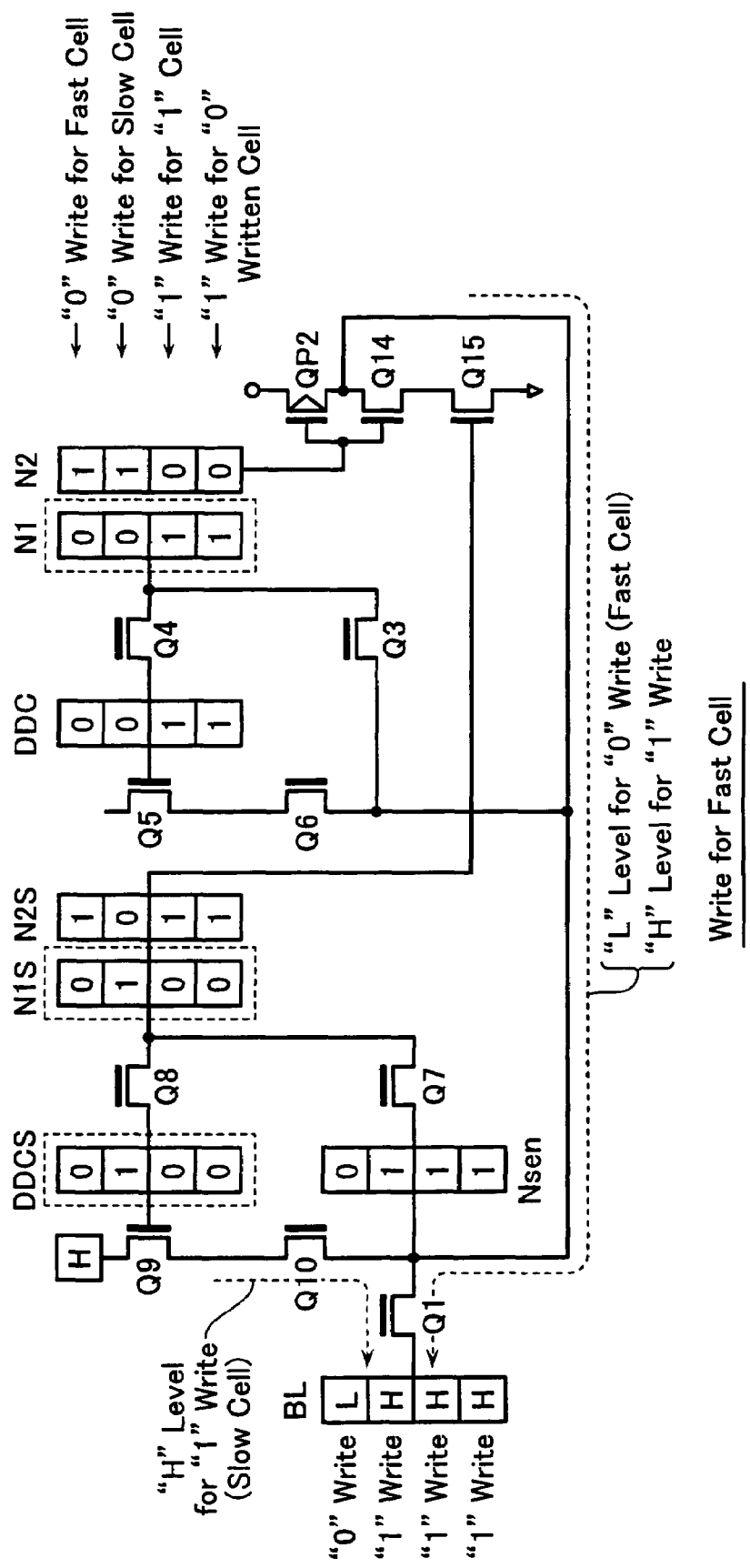
FIG. 11B is a diagram for showing a sense unit operation when fast cells are written in the embodiment.

In case "0" write is performed for fast cells, the write data transfer operation is as shown in FIG. 11B in comparison with FIG. 11A. As shown in FIG. 11B, a "H" level voltage is applied to the drain of transistor Q9; and transistor Q10 is turned on. As a result, with respect to Case(2), which is set as "1" write (write inhibiting) at this time regardless of the original "0" write case, a "H" level voltage is transferred to the bit line with the speed switching circuit 15.

A "L" level for "0" write fast cell (Case(1)), and a "H" level for the remaining "1" write cells (Cases(3) and (4)), are supplied from the bit line drive circuit 16. The detail will be explained as follows. With respect to Cases(3) and (4), PMOS transistor QP2 is on while NMOS transistor Q14 is off in the bit line driver circuit 16 in response to "0" data (="L") of the node N2, so that a "H" level voltage is output to be transferred to the bit line. With respect to "0" write cases, Cases(1) and (2), PMOS transistor QP2 is off while NMOS transistor Q14 is on in response to the data of the node N2. Further, with respect to "0" write case for fast cells, Case(1), NMOS transistor Q15 is on in response to the data of the node N2S, so that a "L" level voltage is output to be transferred to the bit line.

When write pulse P7 is applied after write pulse P2 application, the discriminating data in the data latch 11 is preliminarily inverted, thereby designating slow cell write again. The data inverting operation is the same as explained with reference to FIGS. 12A to 12C.

According to this embodiment, when data write for slow cells is initially performed based on the resultant of the write speed detection, a large voltage step ΔVpgm(s) is used, while a series of write pulses (P1, P2, P3, . . . ) applied to the fast cells are sequentially stepped-up by ΔVpgm from the basis of pulse P1; and a series of write pulses (P6, P7, P8, . . . ) applied to the slow cells also are sequentially stepped-up by ΔVpgm from the basis of pulse P6.

In the conventional write scheme shown in FIG. 6, the former half portion of the write cycles, the write pulses in which are relatively lower in voltage, is effective for fast cells while the latter half portion (for example, since pulse P6), the write pulses in which are higher in voltage, is effective for slow cells. By contrast, in this embodying write scheme shown in FIG. 7, it can be said as follows: the pulse applications in the latter half portion (for example, since pulse P6) in FIG. 6, which are effective for slow cells, are advanced to be substantially in parallel with the pulse applications for fast cells. As described above, voltage values and timings of the write pulses are set to be suitable in such a way that data write for the fast cells and slow cells are progressed in parallel, whereby data write speed-up may be achieved.

Further, in this embodiment, two write pulses, which are for fast and slow cells, respectively, are successively applied, and then a write-verify is performed simultaneously for both of fast and slow cells. With this scheme, the number of write-verify operations may be reduced, and this leads to high-speed data write.

The detail will be explained below. Supposing, for example, that the slowest cell is written into "0" data with pulse P10 in the write scheme shown in FIG. 6, it is in need of ten times write pulse applications and ten times verify-read operations until write completion. By contrast, according to this embodiment, write pulses are applied ten times; verify-read operations are performed five times; and speed-verify operation is performed once. Therefore, the number of verify operations is decreased by four. Supposing that it takes about 25 μsec for one verify-read operation, the total data write time may be shortened by about 100 μsec.

Figure 8:
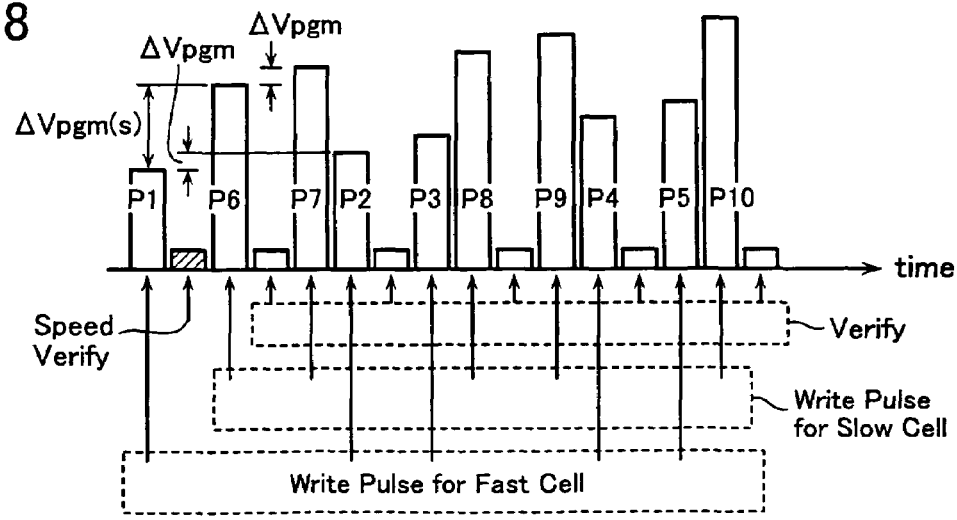
FIG. 8 is an example varied from the write pulse application operation shown in FIG. 7.

FIG. 8 shows another write operation, which is slightly varied from that shown in FIG. 7. In the example shown in FIG. 7, after the first write-verify, which follows after the write pulses P1 and P6, successive two write pulses are arranged in such an order that the write pulse for slow cells goes ahead. By contrast to this, in the example shown in FIG. 8, the write order of the slow cell and fast cell is alternately changed. Except this, the example shown in FIG. 8 is the same as that shown in FIG. 7. With this variation, it becomes possible to do high-speed data write.

Embodiment 2

As described in the Embodiment 1, the technique in accordance with the present invention is to do write pulse applications for slow cells and fast cells in parallel with each other, thereby reducing the write-verify numbers. However, the timing of the write speed verify and read method thereof may be set to be different from those in the Embodiment 1.

Figure 5:
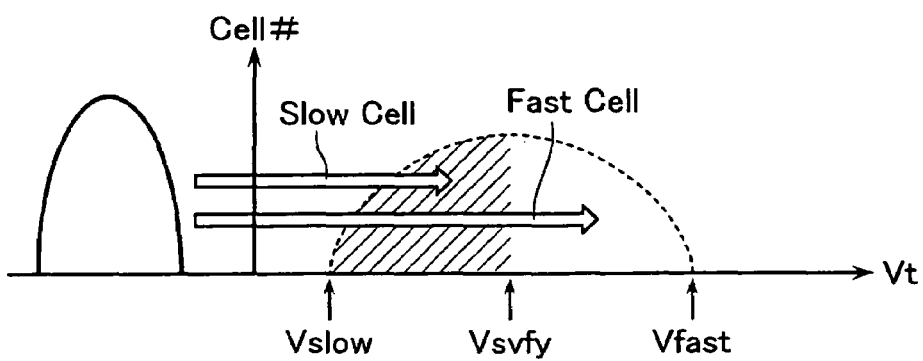
FIG. 5 is a diagram for explaining the write speed judgment operation (speed verify).

FIG. 5 shows an ideal write speed verify condition. As shown in FIG. 5, it is desirable that the judging level (speed verify voltage) Vsvfy for distinguishing between the slow cells and fast cells is set to be an average value of the write speed distribution, i.e., about the center between the highest value Vfast and the lowest value Vslow of the threshold distribution obtained by a write operation.

However, to do such the ideal speed judgment, it is necessary that the data threshold distribution prior to data write is sufficiently separate from write destination one. In detail, it is required of the threshold voltage difference between the two threshold distributions to be equal to or larger than (Vfast-Vslow)/2. Further, in case the initial write pulse is set to be a little low in voltage, there is a fear that the fast cells also are not shifted much in threshold voltage.

Figure 14:
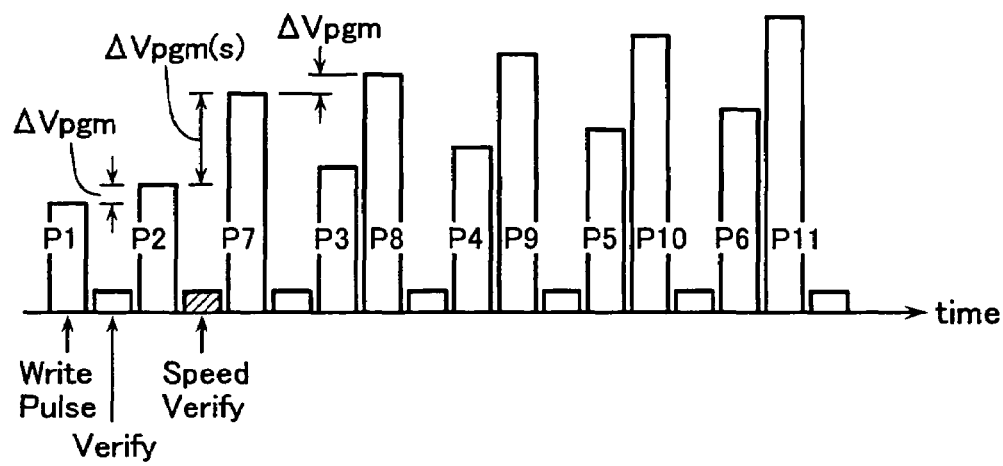
FIG. 14 is a diagram for showing a step-up voltage example, which is set in accordance with the speed verify result.

In consideration of the above-described situations, FIG. 14 shows such an embodiment that the write speed verify timing is set to be later than that in the Embodiment 1. FIG. 14 contains the same steps as the conventional scheme shown in FIG. 6 as follows: the initial write pulse P1 is applied; and then write-verify is performed; following it the second write pulse P2 is applied.

Write speed verify is performed after the second write pulse P2 application. Hereinafter, in accordance with the discriminating data obtained at the write speed verify step, write pulses (P7, P8, P9, P10, P11) for slow cells and write pulses (P3, P4, P5, P6) following P2 for fast cells are alternately applied.

As a result of that the write speed verify timing is shifted to be later as described above, the write threshold voltage distribution may be shifted to a desirable level for judging the write speed. Alternatively, the write speed verify may be shifted to be further later, for example, after the write pulse P3 or P4.

In case the data threshold voltage of the write destination is not sufficiently separated from the unwritten cell's one, with making the write speed verify timing later, there is provided a probability that some memory cells with a high write speed has reached the target write level. However, when a memory cell with a high write speed passes the write verify, it is changed from the "0" write state to the "1" write state like as the conventional case. Therefore, over-write or over-program does not occur in such the case. In other words, in case the write speed verify interrupts the write cycles at a certain timing at the beginning, only the remaining "0" write cells at the timing are subjected to be the write speed verify. Therefore, there is no problem.

It is desirable that not only the write speed verify timing is adjusted but also the read method in the write speed verify is made adjustable. For example, in the Embodiment 1, on the assumption that "0" write cells are in the negative threshold states at the write speed verify time, it is used a source follower read method with 0V applying to the selected word line as shown in FIG. 13. However, the selected word line may be applied with a certain voltage except 0V.

Further, assuming that a lot of cells are in positive threshold voltage states within "0" write cells at the write speed verify time, it can be used a usual read method in such a way as to carry a current from the bit line to the source line under the condition of 0V applying to the selected word line, and then detect the bit line voltage change. Summing up, what is required is such a result that discriminating data for discriminating between the slow cell and fast cell is stored in the data latch 12 of the speed switching circuit 15 shown in FIG. 2.

Figure 15:
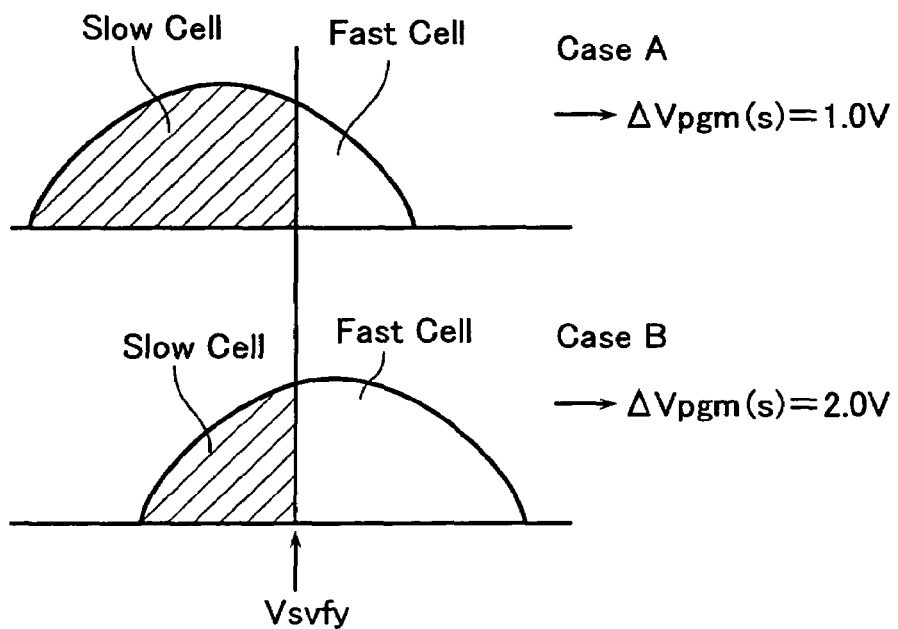
FIG. 15 shows step-up voltage examples set in accordance with the speed verify result.

Even if all things as described above are considered, the write speed judgment is not always preformed at the average write speed position as explained in FIG. 5. For example, as shown in FIG. 15, there will be found case A and case B, in which slow cells and fast cells are relatively more in association with the same write speed verify voltage Vsvfy, respectively. In consideration of this point, the step up voltage ΔVpgm(s) used at the write pulse switching time as shown in FIG. 7 or FIG. 14 is selected as follows: ΔVpgm(s) in the case A is set to be smaller than that in the case B.

As described above, suitably setting the condition of the write speed verify and write voltage, it becomes possible to make the write time shorter in comparison with the conventional case.

Embodiment 3

Although it has not been explained in the above-described embodiments, "write-completion (or write-finish) detection" is performed in the practical write sequence for judging whether "0" data has been written into the entire "0" write cells or not after the write-verify operation. A preferable embodying mode of this write-completion detection will be explained below.

Figure 16:
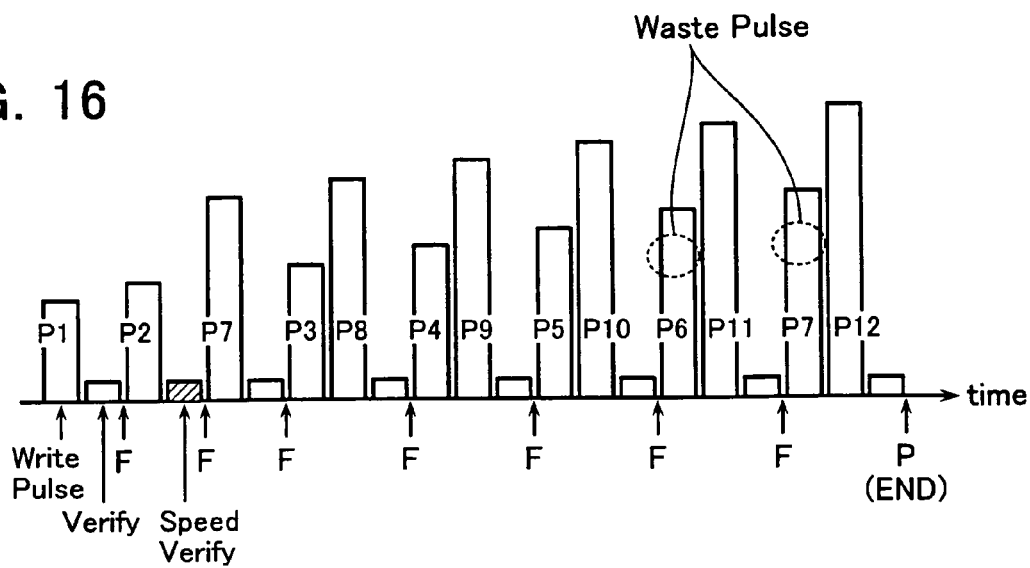
FIG. 16 is a diagram for showing a write pulse application operation in an embodiment, in which a completion detection operation is considered, in comparison with FIG. 14.

FIG. 16 shows an example, in which write-completion detections are inserted after each write-verify step in the write sequence shown in FIG. 14. In FIG. 16, the write-completion detections are shown in such a manner that when data write is incomplete, a fail flag "F" is output, while when write completion is detected, a pass flag "P" is output. The same expression will be used in the following embodiments.

Figure 10E:
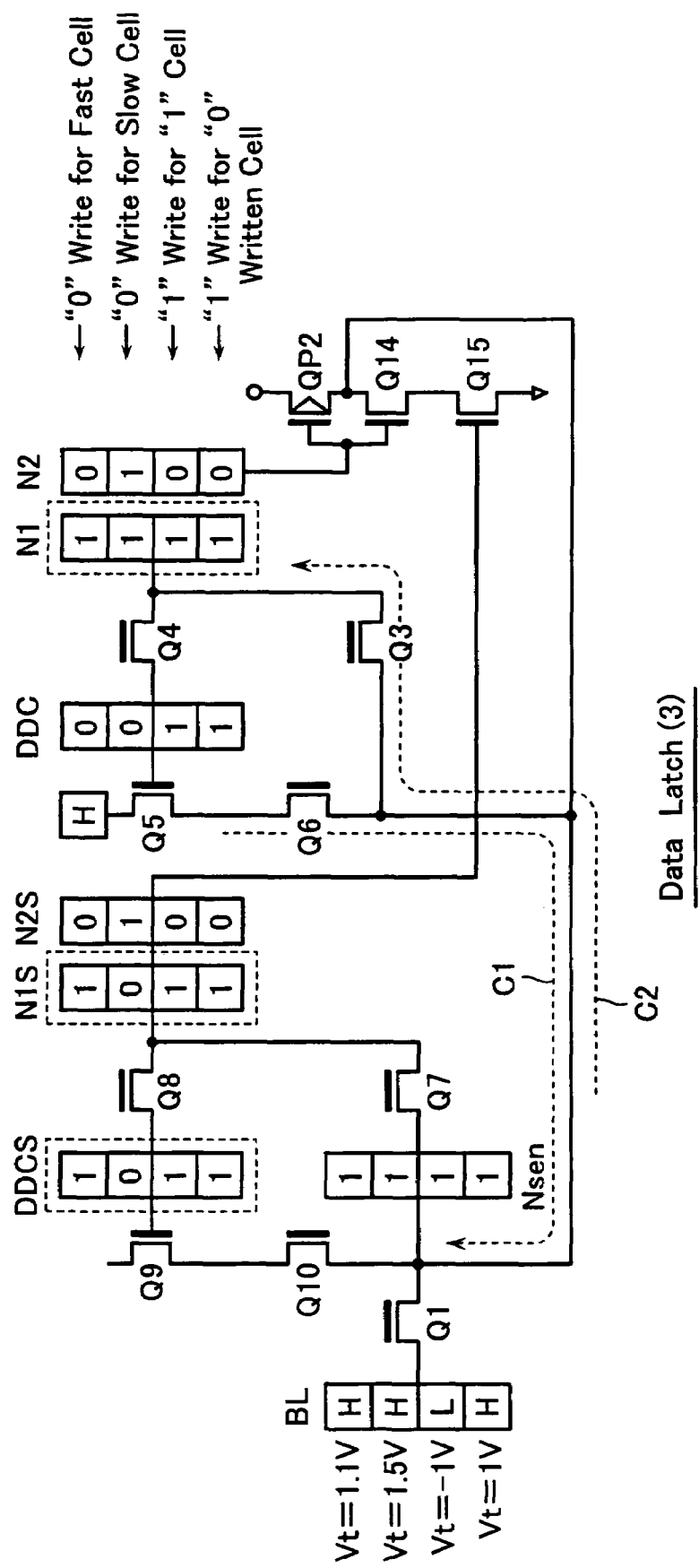
FIG. 10E is a diagram for showing data transition in another data state in comparison with that shown in FIG. 10C.

This write-completion detection is performed, as shown in FIG. 10E, in such a way as to judging whether the entire nodes N1 of data latches 11 in one page sense units SA/PB (data write operations are simultaneously performed in this range) become an all "H" state (i.e., all "1" state) or not.

However, in case the completion detection is performed only based on data stored in the data latch 11, a waste write pulse or pulses are often applied because in the write speed removing technique in accordance with the present invention, voltage application of two kinds of write pulses and verify are repeatedly performed. For example, supposing that data write for fast cells has been completed with write pulse P5 while data write for slow cells has been completed with write pulse P12, write pulses P6 and P7 are waste ones.

Figure 17:
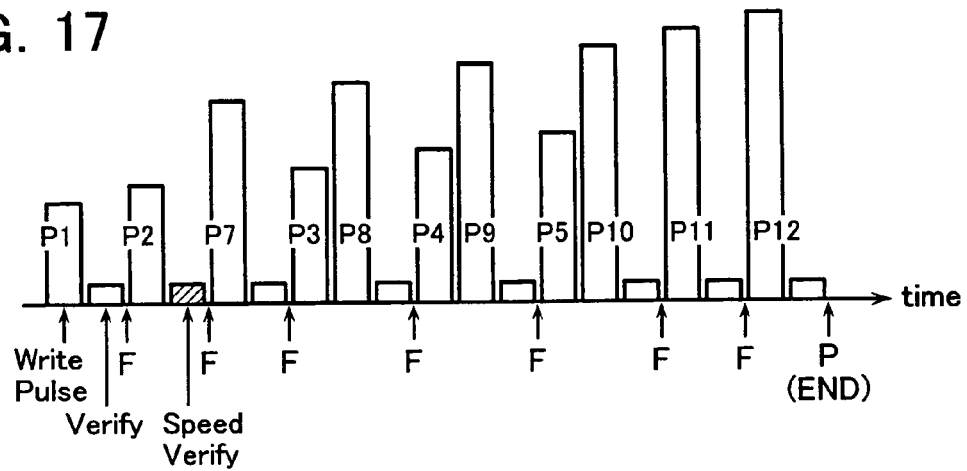
FIG. 17 is a diagram for showing a write pulse application operation, in which waste write pulses shown in FIG. 16 are excluded.

In consideration of this, it is desired that the write-completion detections for slow cell group and fast cell group are performed independently of each other. For example, FIG. 17 shows an example, in which each write-completion detection designated by "F" includes two completion detections, with the write cycles similar to those shown in FIG. 16. As a result, the waste write pulses P6 and P7 shown in FIG. 16 may be removed.

An example of the write-completion detection circuit will be explained with reference to FIGS. 18 and 19, in which the completion detection target is divided into two ones, and write-completion detections are executed for the divided two targets, respectively.

Figure 18:
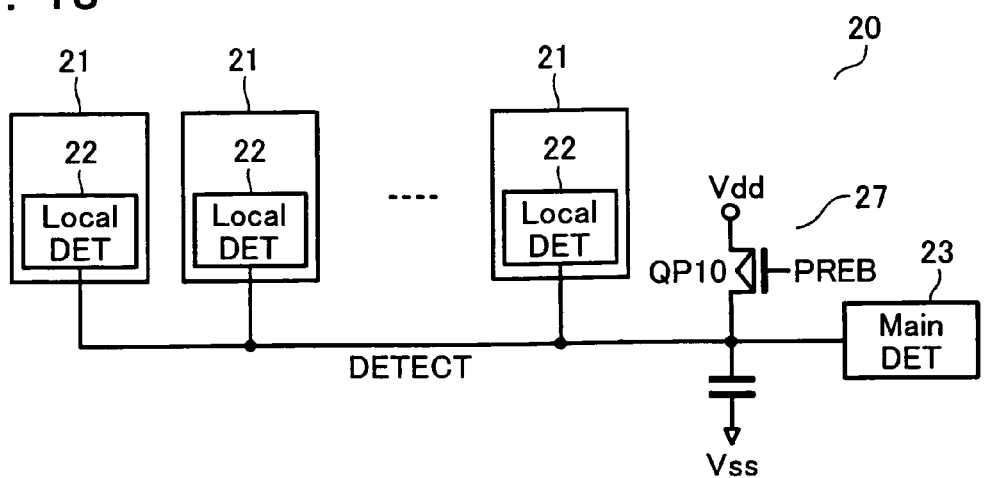
FIG. 18 is a diagram for showing a completion detection circuit.

Write-completion detection circuit 20 is, as shown in FIG. 18, formed of plural completion detection units 21 disposed in parallel with each other. Each completion detection unit 21 has, as shown in FIG. 19, a lower level detection line COM, which is shared by one Byte (eight) sense units SA/PB(0)-SA/PB(7) belonging to one column address, and detects write-completion for each column with the detection line COM.

The completion detection unit 21 is configured to detect with the detection line COM that data of node N2 of the data latch 11 is "H" in such a case that data of node N2S of the data latch 12 in each sense unit is "H". As described above, the node N1S or the complementary node N2S has a function of storing discriminating data for discriminating between the fast cells and slow cells. Therefore, this completion detection unit 21 executes a first completion detection based on the data of the data latch 11 in one case of either one of fast and slow cells; and executes a second completion detection based on the data of the data latch 11 in another case after having inverted the discriminating data in the data latch 12 of the speed switching circuit 15.

Explaining in detail, for each of sense units SA/PB(0)-(7), there is provided a check circuit 25 connected to the detection line COM with NMOS transistors Q21, Q22 and Q23 connected in series, gates of which are supplied with data of the nodes N2S, N2 and a check signal CHK, respectively. Further connected to the detection line COM are a precharge circuit 26 with a PMOS transistor QP20 and a charge-holding capacitor.

It is a local detection circuit 22 that detects whether the detection line COM is kept in a "H" state or not at the write-completion detection time. The output of the local detection circuit 22 serves for driving the higher level detection line DETECT. The completion detection units 21 shown in FIG. 18 are arranged in parallel on a scale of 512 (or 1 k or 2 k) sense units SA/PB, which constitute a page, and connected to the common detection line DETECT.

Connected to the detection line DETECT are a precharge circuit 27 with a PMOS transistor QP10, a charge holding capacitor as similar to the lower level detection line COM and a main detection circuit 23, which is for outputting a final completion detection signal.

Next, the completion detection operation performed with the above-described completion detection circuit 20 will be explained below. In an initial state, signal PREB being "L", both of the signal lines COM and DETECT are charged-up to an "H" level. A write completion detection mode being set with PREB="H", the signal lines COM and DETECT become to be in a floating state.

Then, when the check signal CHK becomes "H" in a state that the speed switching circuit 15 is set in a certain data state, check circuit(s) 25 in sense unit(s) SA/PB, in which the node N2S is "H" and the node N2 is "H", will discharge the detection line COM. This state designates that the data write has not been completed in at least one sense unit SA/PB. The check circuits 25 in eight sense units SA/PB are connected in parallel to the signal line COM. Therefore, if there is one sense unit, in which data write has not been finished, the signal line COM becomes "H".

Suppose that the local detection circuit 22 is for grounding the signal line DETECT. If there is at least one memory cell, data write of which has not been completed, the signal line DETECT will be discharged to be "L" because the plural completion detection units 22 share the signal line DETECT. In case the signal line DETECT is "L", the main detection circuit 23 detects that there is an unwritten memory cell. In other words, in case the signal line DETECT is kept at "H", it will be detected that "0" write of the entire memory cells to be written into "0" has been completed.

Supposing, for example, that "L" at the node N2S serves as discriminating data for designating a slow cell, the corresponding sense unit SA/PB is excluded from the above-described completion detection operation target. Therefore, in the above-described completion detection operation, "0" write completion detection will be performed for only fast cells. Then the discriminating data in the data latch 12 of the speed switching circuit 15 is inverted, following it write-completion detection operation is performed like as above-described. As a result, write completion detection for slow cells may be done.

By use of the completion detection method described above, even if in case it is difficult to finish the data write of slow cells as shown in FIG. 16, it becomes possible to omit such the waste pulse application as shown in FIG. 17.

Embodiment 4

Although, in the Embodiment 3 described above, the write-completion detection is performed after the write-verify operation, it may be performed within the write pulse application step. This is specifically effective for improving the write efficiency in a case where the write cycle number is large. In this scheme, the end of the write cycle becomes a write pulse application operation, in which a completion state is detected with the write completion detection operation.

Figure 20:
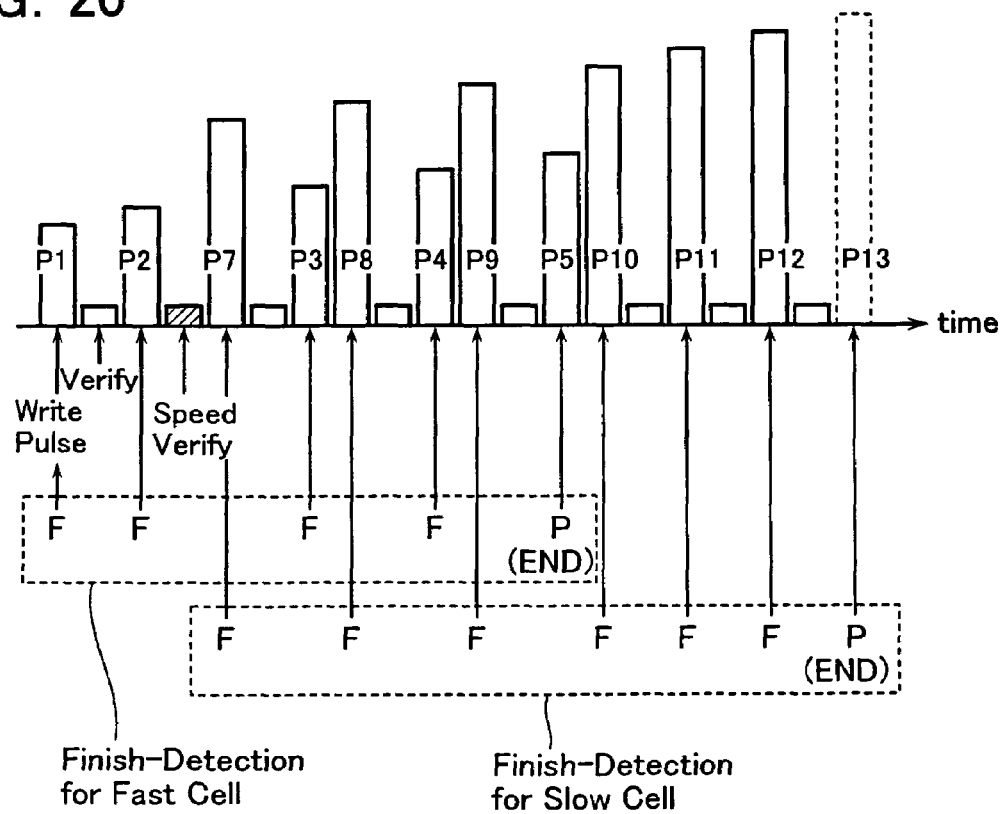
FIG. 20 is a diagram for showing a write pulse application operation in an embodiment, in which completion detection is performed in response to the write speed, in comparison with FIG. 17.

FIG. 20 shows a write cycle for explaining this Embodiment 4. Although the basic write cycle is similar to that in the Embodiment 3 shown in FIG. 17, the write completion detection is inserted in the write pulse application step. Explaining in detail, the write-completion detection for fast cells is performed in each pulse application of the write pulse series of P1, P2, P3, P4 and P5, while the write-completion detection for slow cells is in each pulse application of the write pulse series of P7, P8, P9, P10, P11, P12 and P13.

Figure 19:
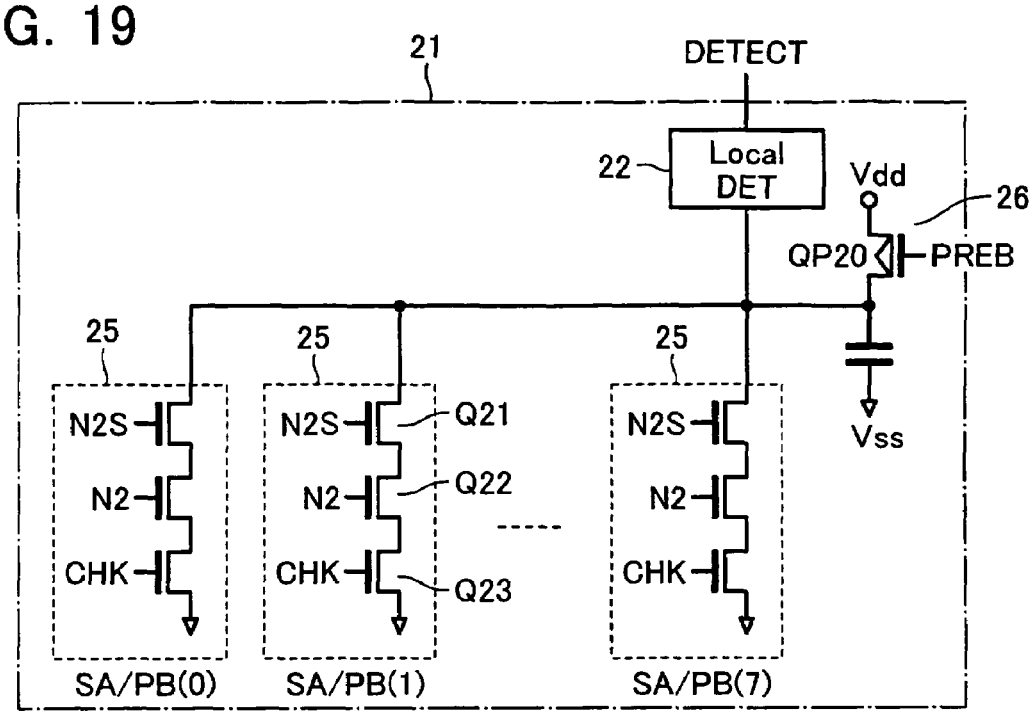
FIG. 19 is a diagram for showing a detection unit in the completion detection circuit.

To do completion detections for fast cells and slow cells independently of each other, it is preferably prepared the write-completion detection circuit 20 described with FIGS. 18 and 19 as similar to Embodiment 3. With this completion detection circuit 20 and by use of the discriminating data inverting operation with the write speed switching circuit 15, the completion detection operations for the fast cells and slow cells may be performed independently.

Therefore, according to this Embodiment 4, the waste write pulse application is preventable as well as Embodiment 3. In addition, it is possible to make the write time shorter because the completion detection is performed in the write pulse application time.

Embodiment 5

Next, explained below is an embodiment, in which the present invention is adapted to a case where two data states with different threshold voltages are written simultaneously.

In four-level data storage schemes, there is such a method that the upper page writes are performed simultaneously for two data states with different threshold voltages. For example, FIG. 21 shows a write pulse application example with such the scheme (for example, refer to Unexamined Japanese Patent Application Publication No. 2003-196988).

Suppose that the write pulses are increased with a step-up voltage of ΔVpgm in order from the initial one P1. To write the data state "X" with the lower threshold voltage, write pulses P1-P8 are used. Therefore, after each of pulses P1-P8, Verify1 is inserted for verifying the data state "X". To write the data state "Y" with the higher threshold voltage, write pulses P5-P13 are used. Therefore, after each of pulses P5-P13, Verify2 is inserted for verifying the data state "Y".

Figure 21:
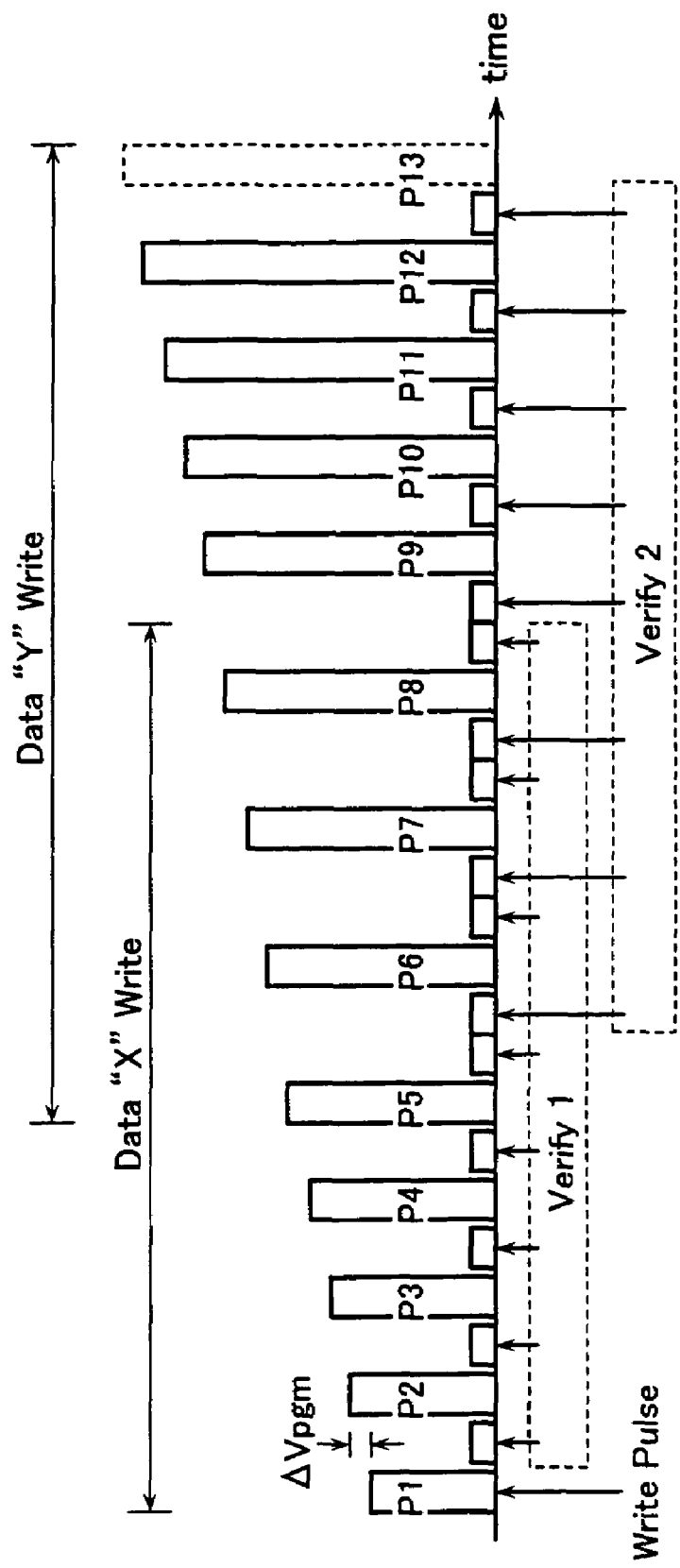
FIG. 21 is a diagram for showing a write pulse application operation in a case where two data states are written simultaneously.
Figure 22:
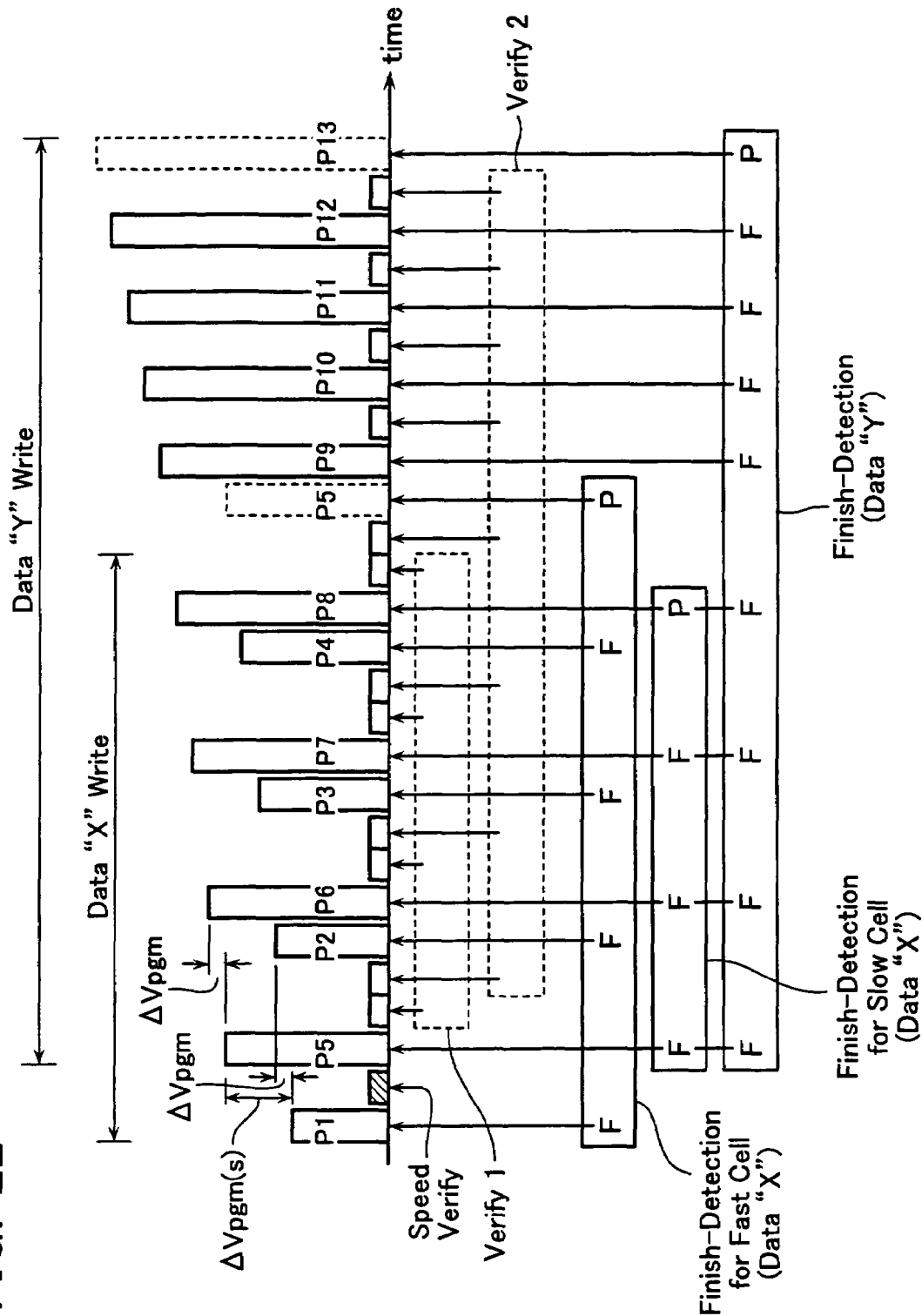
FIG. 22 is a diagram for showing a write pulse application operation in an embodiment, in which two data states are written simultaneously, in comparison with FIG. 21.

FIG. 22 shows Embodiment 5 drawn from the basic write method shown in FIG. 21 in accordance with this invention, in which data writes are performed in parallel for slow cells and fast cells. In practice, with respect to the lower threshold side data "X", different write pulses are used for fast cells and slow cells as well as the above-described embodiments. In contrast, with respect to the higher threshold side data "Y", the write pulses P5, P6, P7 and P8, which correspond to data "X" write for slow cells in the data "X" write cycle, are used in the former half period of the data "Y" write cycle, while write pulses P9-P12(P13), which are successively stepped-up, are used in the latter half period of the data "Y" write cycle.

The detail is as follows. As similar to the Embodiment 1, write-verify is performed after the initial pulse P1 application to get the discriminating data for identifying the write speed distribution of cells to be written into data "X". Next, write pulse P5 is applied for writing the slow cells. Write-verify Verify1 is performed for fast cells and slow cells in the data "X" write cells, and then write-verify Verify2 is performed for verifying data "Y" write. Following it write pulse P2 is applied for writing fast cells in accordance with the discriminating data.

Hereinafter, as similar to Embodiment 1, with respect to data "X" write, alternate applications of write pulses P1-P4 for fast cells and write pulses P5-P8 with relatively high levels for slow cells, and write-verify Verify1 for the respective cells are repeated.

The write-completion detection of data "X" is the same as Embodiment 4. That is, completion detections for fast cells are performed in each application time of the write pulses P1, P2, P3 and P4 (P5) for the data "X" write fast cells while completion detections for slow cells are performed in each application time of the write pulses P5, P6, P7 and P8 for slow cells.

With respect to the data "Y" write with the higher threshold voltage, write pulses P5-P8 for data "X" write slow cells and write pulses P9-P12(P13) followed them are used. In practice, it is required of the first write pulse P5 for slow cells to be set at a voltage so that it does not lead to over-writing at the data "Y" write time. In this case, it is required of the write speed judgment read level to be adjusted at a suitable level in accordance with that the voltage difference ΔVpgm(s) between the pulses P1 and P5 corresponds to what level of the write speed difference.

In case of FIG. 22, it is supposed that data "X" write ends with the write pulse P8 application. Therefore, the write-verify Verify1 for verifying data "X" starts just after the pulse P5 and ends after the pulse P8.

The write-verify Verify2 for verifying data "Y" starts after the pulse P5 to be continued after the pulse P12 (or P13). Write-completion detections for data "Y" are performed in each pulse application time of the write pulses P5-P12(P13).

According to this embodiment, the write-verify number may be reduced with respect to the lower threshold data "X" write in comparison with the scheme shown in FIG. 21, resulting in that the write time is shortened on the whole.

Although, in this embodiment, the lower threshold data "X" write cells are divided into fast cells and slow cells, and different write conditions are adapted to them, it should be appreciated that the higher threshold data "Y" write may be controlled like as in the above-described data "X" write.

Embodiment 6

Next, another embodiment will be explained below, in which three data states defined by different threshold voltages are simultaneously written. Such the case is in the four-level data storage scheme as explained with FIG. 4. In this case, simultaneously written are three data states defined by: the upper page writes (1) and (2) for writing data states "A" and "C", respectively, and the lower page write (2) for writing data state "B".

Figure 23:
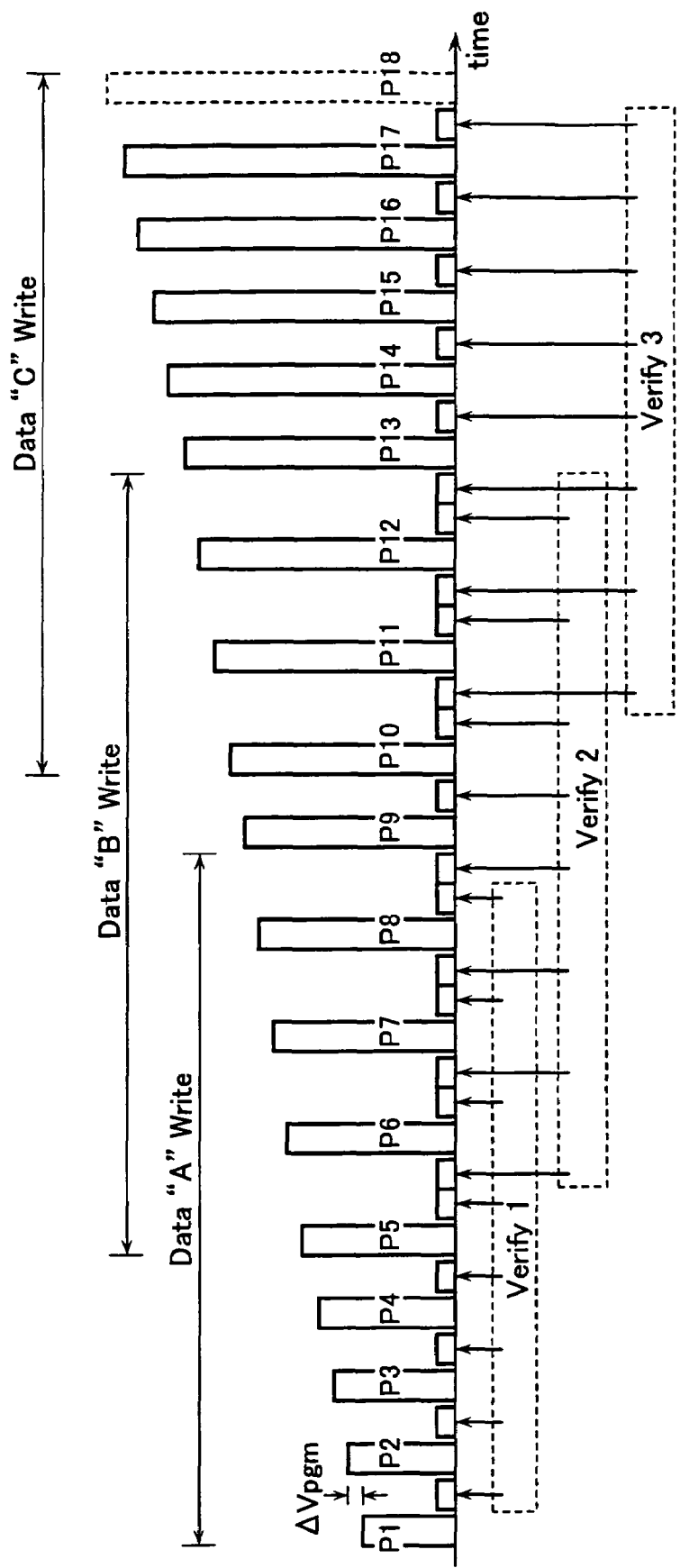
FIG. 23 is a diagram for showing a write pulse application operation in a case where three data states are written simultaneously.

FIG. 23 shows a write operation example, in which the three data states "A", "B" and "C" are simultaneously written. Data write for the lowest threshold data state "A" is performed with write pulses P1-P8; data write for the middle threshold data state "B" is with write pulses P5-P12; and data write for the highest threshold data state "C" is with write pulses P10-P18.

In correspondence to these write pulse applications, write-verify operations Verify1, Verify2 and Verify3 are performed for verifying the data states "A", "B" and "C" with verify voltages Vavfy, Vbvfy and Vcvfy, respectively, as shown in FIG. 4.

Figure 24:
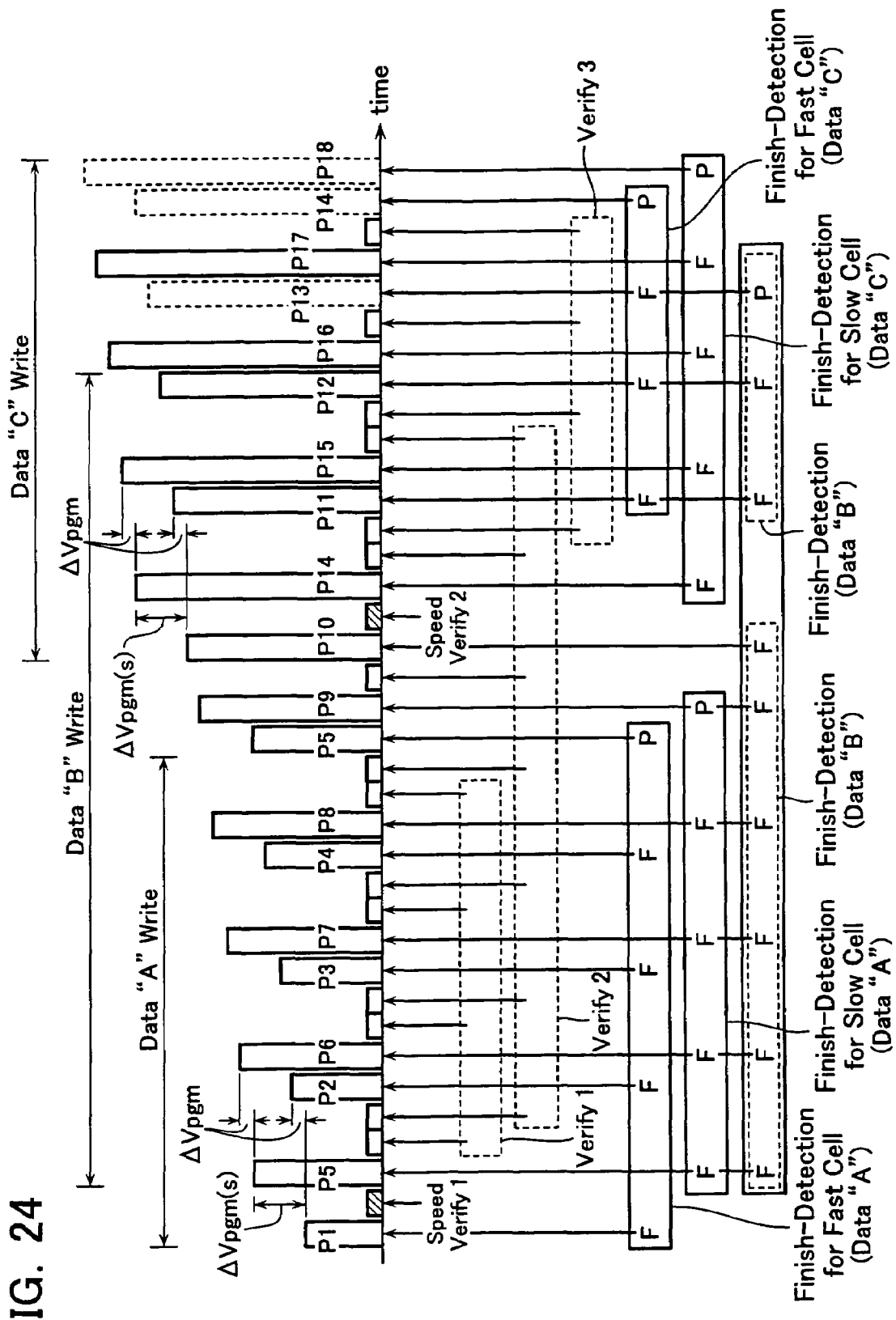
FIG. 24 is a diagram for showing a write pulse application operation in an embodiment, in which three data states are written simultaneously, in comparison with FIG. 23.

FIG. 24 shows an Embodiment 6 drawn from the above-described data write example in accordance with the present invention. In this embodiment, to perform data "A" write and data "B" write simultaneously in the former half of the write cycle, a first write speed judgment-read "Speed Verify1" is performed at the beginning of the write sequence. To perform data "B" write and data "C" write simultaneously in the latter half of the write cycle, a second write speed judgment-read "Speed Verify2" is performed midway or halfway in the write sequence.

At the lower column of FIG. 4, imaginary data states (shown by dotted lines) and the corresponding verify voltages Vsvfy1 and Vsvfy2 are shown at the above-described two speed verify times.

Data "B" write, which partially overlaps data "A" and data "C" write cycles, is executed as follows: data "B" write in the former half, which is performed simultaneously with data "A" write, is performed simultaneously with the slow cells in data "A" write cells with the higher voltage side write pulses;

and data "B" write in the latter half, which is performed simultaneously with data "C" write, is performed simultaneously with the fast cells in data "C" write cells with the lower voltage side write pulses.

The detail will be explained below. As similar to the Embodiment 1, with respect to writing of data "A" with the lowest threshold voltage, speed judgment-read (speed verify) is performed after the initial write pulse P1 application. Based on the speed verify resultant, write pulse P5 for slow cells is preceded. After the write pulse application of P1 and P5, write-verify Verify1 is performed for fast cells and slow cells of data "A" write, and write-verify Verify2 for data "B" write is performed. Hereinafter, data "A" write is the same as in Embodiment 1.

The while, the discriminating data in the peed switching circuit 15 in the corresponding sense unit is set so that data "B" and "C" write are performed with write pulses P5, P6, P7 and P8, which have relatively higher voltages to be used for data "A" write slow cells.

Suppose that the data "A" write and data "B" write completion with the write pulses P5 and P12, respectively. In the period from the write pulse P5 to P9, i.e., while data "A" write and data "B" and "C" write are performed simultaneously, the write verify Verify1 and Verify2 are performed.

Data "B" write has not yet completed when the write pulse P9 is applied. Therefore, after the write pulse P9 and before it becomes in need of the write-verify for data "C", the write-verify Verify2 is performed only for data "B".

In the pulse application times of the write pulses P1-P4, which are used for data "A" write for fast cells and write pulse P5 followed them, write-completion detections are inserted for these data write, while in the pulse application times of the write pulses P5-P8, which are used for slow cells and write pulse P9 followed them, write-completion detections are inserted for these data write. Further, data "C" write in the former half time while data "A" and "B" write are performed simultaneously, is performed with the write pulses P5-P10 used for slow cells, and completion detections for data "C" write are inserted in the pulse application times thereof.

After the write pulse P10, it becomes in need of write-verify Verify3 for data "C". At this time, the threshold voltages of data "C" write memory cells are going to near the desired threshold distribution, therefore the write speed difference between cells, into which data "C" is written, appears.

Accordingly, the write speed judgment for data "C" write, i.e., the second speed verify, Speed Verify2, is performed after write pulse P10 application in the medium of the write cycle. Data transferring in the sense unit at this second speed verify time will be explained later.

The second speed verify is performed in a state where data "A" write has been completed, and data "B" write and "C" write are to be continued. Therefore, in accordance with the second speed verify, slow cells in the memory cells, into which data "C" is to be written, are drawn. Data "B" write has been treated as data "A" write for slow cells by the time of write pulse P10. When boosting the write voltage, after the second speed verify, for accelerating the data "C" write, it is required of data "B" write to keep the step up voltage.

Therefore, after the second speed verify, data write "B" is to be treated as data "C" write for fast cells. That is, after write pulse P10, write pulses P11, P12, P13 and P14, which are successively stepped-up by ΔVpgm and serve as write pulses for data "C" write fast cells, are used for writing data "B". In the example shown in FIG. 24, data "B" write is finished by the write-verify2 after write pulse P12 application, and pass flag "P" is output at the timing of write pulse P13.

After the second speed verify, slow cell write operations within data "C" write are preceded in accordance with the gotten discriminating data. Accordingly, after the write pulse P10, slow cell-use write pulse P14, which is higher than P10 by ΔVpgm(s), is inserted, following it write pulses P15, P16, P17 and P18, which are successively stepped-up by ΔVpgm, are used for data "C" write for slow cells.

Data "B" write-completion is detected when the write pulse P13 is applied, and as write-verify only Verify3 for data "C" write is remained after the pulse P17. Hereinafter, only data "C" write will be continued. In the example shown in FIG. 24, data "C" write for slow cells and data "C" write for fast cells end at the timings of write pulses P14 and P18, respectively.

As described above, in case three data states are written, it is desirable to do speed-verify twice, and set a write mode twice for writing fast cells and slow cells simultaneously. In general, in case more than three data states are written, it is desirable to do speed-verify plural times, and set write mode plural times for writing fast cells and slow cells simultaneously.

As described in this embodiment, with respect to the lower threshold side data state within two data states to be simultaneously written, two kinds of write pulses are used properly. In this case, the higher voltage one in the two kinds of write pulses is used for writing the higher threshold side data state, thereby resulting in that the write efficiency becomes high.

In addition, the above-described scheme of this embodiment may be adapted to such a case that four or more data states are written simultaneously.

Next, with reference to FIGS. 25A to 25D, data changes in the sense unit SA/PB at the second write speed verify, Speed Verify2, time in this embodiment will be explained below. In these drawings, with respect to the respective nodes in the sense unit SA/PB, data states of six cases, Case(1) to (6), are shown in order from the top to the bottom, as follows: data "B" write for a fast cell(Case(1)); data "B" write for a slow cell(Case(2)); data "C" write for a fast cell (Case(3)); data "C" write for a slow cell (Case(4)); "1" write for a cell in an erase state "E" (Case(5)); and "1" write for a cell, which has already been written (Case(6)).

Figure 25A:
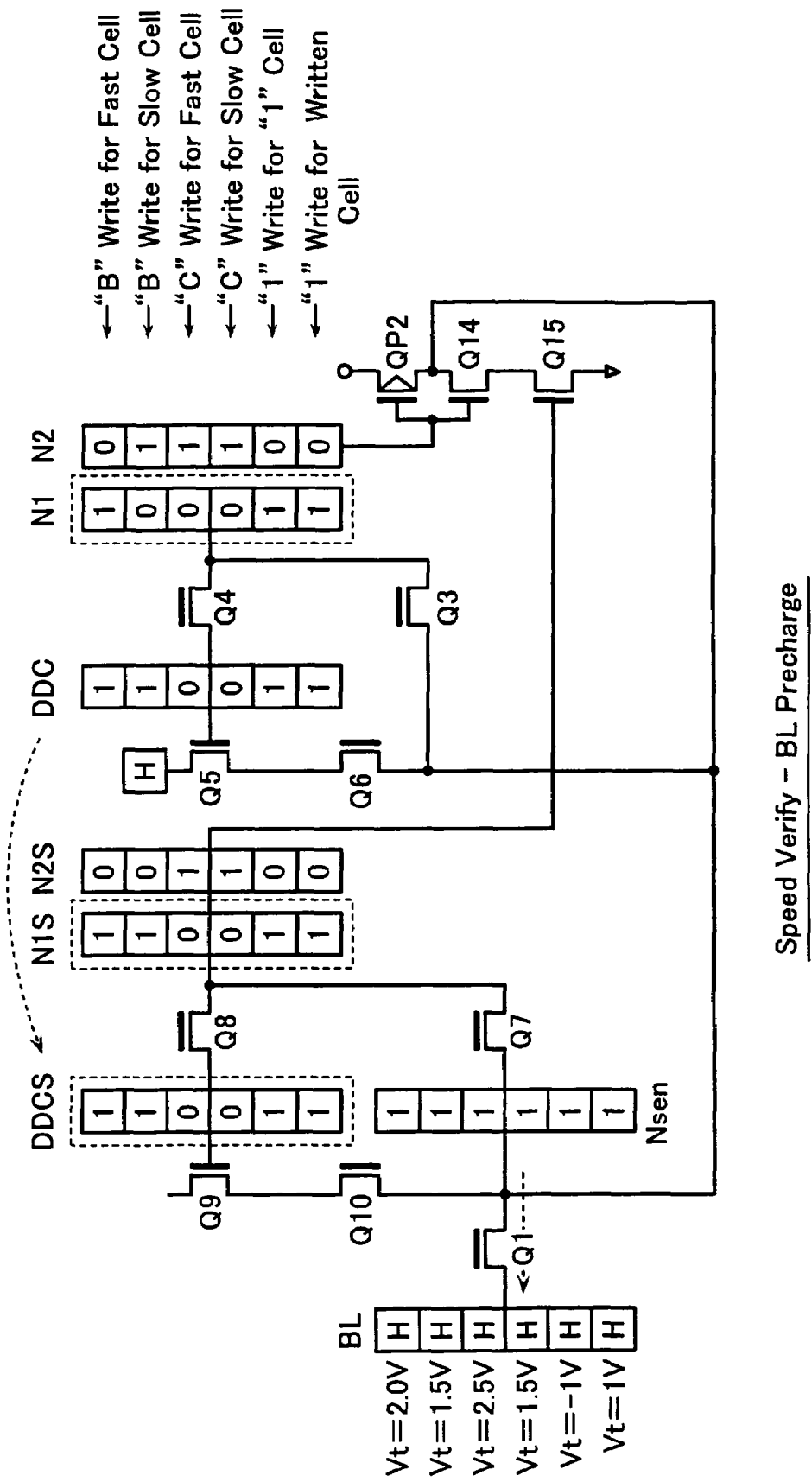
FIG. 25A is a diagram for showing data transition and bit line precharge operations in the sense unit at the speed verify time in the embodiment.

As shown in FIG. 25A, with respect to the above-described six cases, data "1", "0", "0", "0", "S1" and "1" before write speed verify "Speed Verify2" are stored, respectively, at node N1 of the data latch 11. At this timing, data "1" of Case(1) designates a state where data "B" write has been completed; data "O" of Case(2) designates a state where data "B" write has not been completed; data "0" of Case(3) and data "0" of Case(4) designate states where data "C" writes have not been completed; data "1" of Case(5) designates a non-writing (write-inhibiting) state; and data "1" of Case(6) designates a non-writing state due to that data "A" write has been completed by the time of this write speed verify.

At the node DDC, data "1" of Cases(1) and (2), and data "0" of Cases(3) and (4) serve as discrimination data for discriminating between "B" write and "C" write; and data "1" of Cases(5) and (6) show that a non-writing state set at the beginning and another non-writing state set on the way, respectively.

Although the detail is omitted with respect to the data state in the sense unit SA/PB during data "A", "B" and "C" are simultaneously written by the time of the write speed verify, "Speed Verify2", whether it's "A" write or not may be discriminated based on whether the data at the node N3 of the data latch 13 is "0" or not. At the timing of write speed verify, Speed Verify2, as shown in FIG. 24, "A" write has been finished, so that the write-verify for verifying data "A" write, Verify1, is not executed. Therefore, there is no need of considering data of the data latch 13 in the write speed verify, Speed Verify2, and it can be treated with a case where data write has been completed, as shown in Case(6).

As described above, as the write operations after Speed Verify2, "B" write and "C" write are to be continued, and "C" write for fast cells and "B" write are performed with the same write pulse application operations. Therefore, by use of identifying data stored at the node DDC for distinguishing between "B" write and "C" write, the write speed verify, Speed Verify2, is performed. For this purpose, the data held at the node DDC will be transferred to the node DDCS via the node Nsen and data latch 12.

FIG. 25A shows a data state when the bit lines are precharged after data transferring from the node DDC to the node DDCS. At this stage, it is assumed that threshold voltages Vt of the above-described six cases are: 2.0V, 1.5V, 2.5V, 1.5V, −1V and 1V, respectively.

Initially, speed verify-use verify voltage Vsvfy2 (for example, 1.8V) is applied to a selected word line in a selected NAND cell unit; read pass voltage Vread to non-selected word lines in the same NAND cell unit; and 4V to the drain side select gate line SG2. Under this condition, as shown in FIG. 25A, the bit line BL is precharged to a certain "H" level by use of the precharge transistor Q2 and clamping transistor Q1 in the sense unit.

Figure 25B:
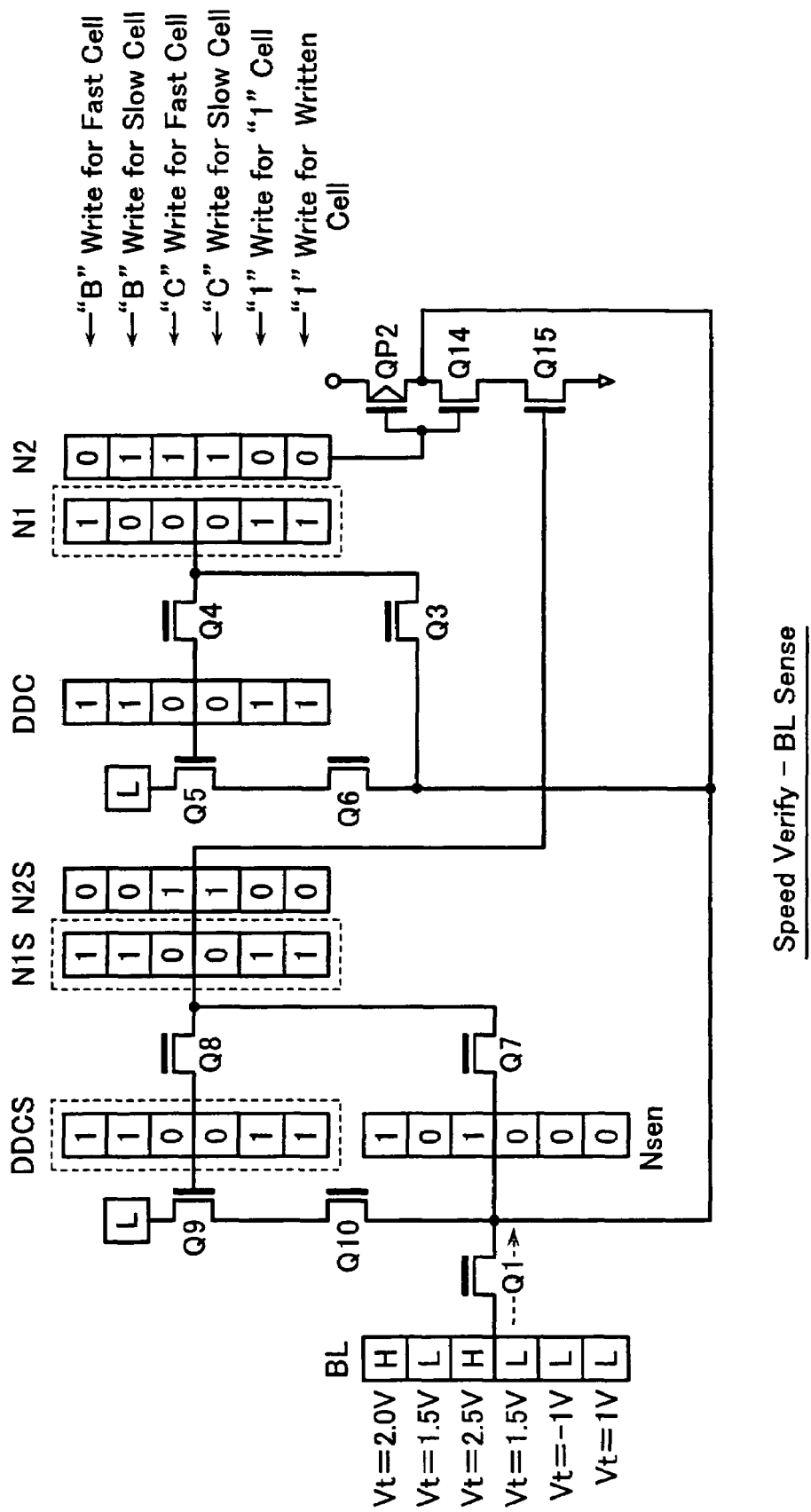
FIG. 25B is a diagram for showing data transition (bit line data sensing) in the sense unit at the speed verify time.

Next, after stopping the bit line precharge, the bit line is discharged with 4V application to the source line side select gate line SG1. The bit line discharge state is defined as: non-discharge (H), discharge (L), non-discharge (H), discharge (L), discharge (L) and discharge (L) in correspondence to the cell threshold voltage 2V, 1.5V, 2.5V, 1.5V, −1V and 1V, respectively. This bit line discharge state is sensed with the clamping transistor Q1, the gate of which is applied with a sense-use voltage, thereby, as shown in FIG. 25B, resulting in that data of the sense node Nsen becomes: "1", "0", "1", "0", "0" and "0" in correspondence with the six cases.

The object of the write speed verify at this time is to get write speed discriminating data in association with data "C" write cells. In FIG. 25B, there are shown 2.5V threshold case and 1.5V threshold case of data "C" write cells. The sensed results, "1" and "0", which have been gotten in correspondence to the two threshold cases as shown in FIG. 25B, serve as the objective discriminating data. Therefore, with data treatment as shown in FIGS. 25C and 25D, the remaining data of "B" write cell and "1" write cell will be restored into the initial data states.

Figure 25C:
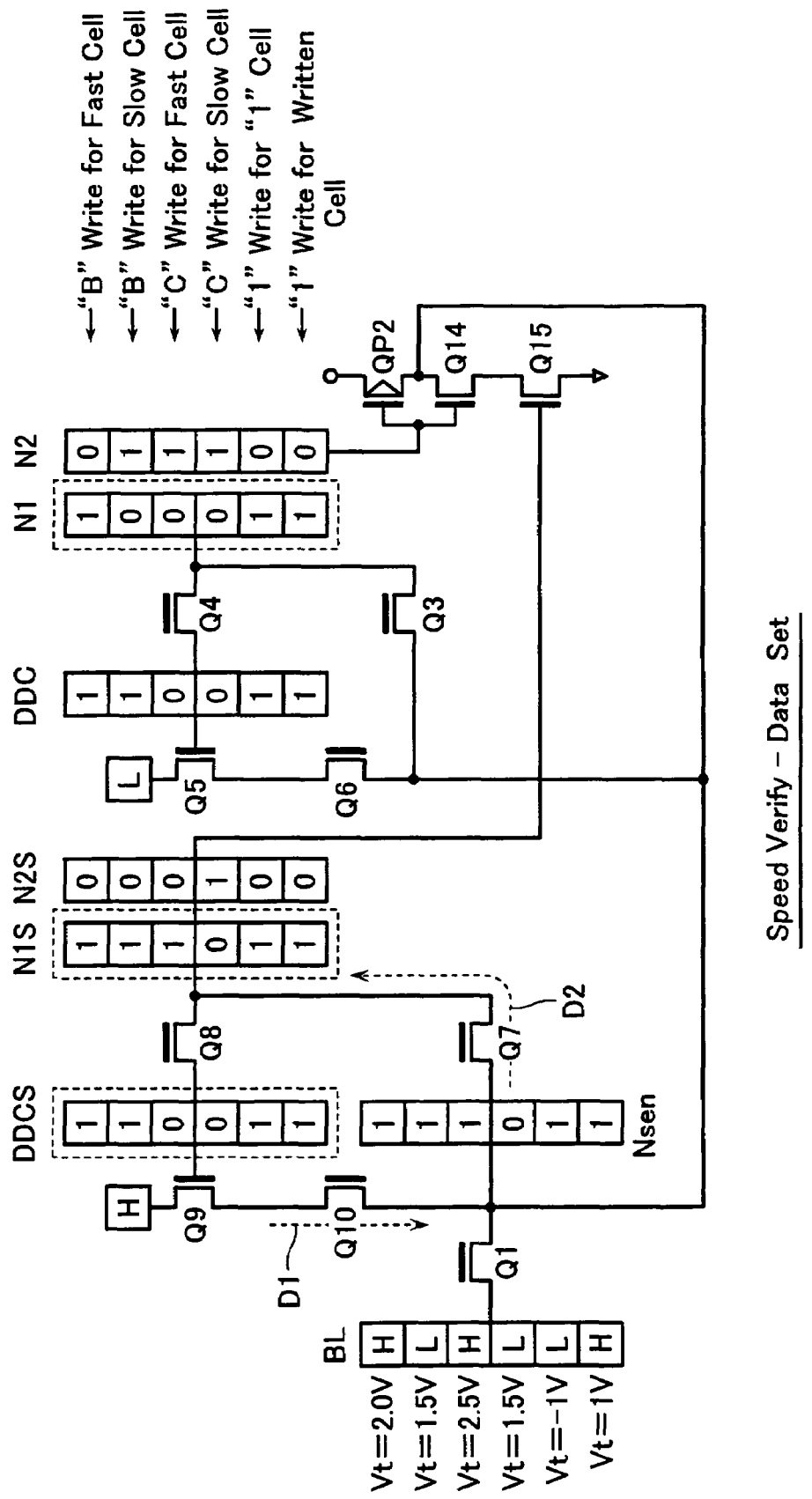
FIG. 25C is a diagram for showing data transition (data transferring) in the sense unit at the speed verify time.
Figure 25D:
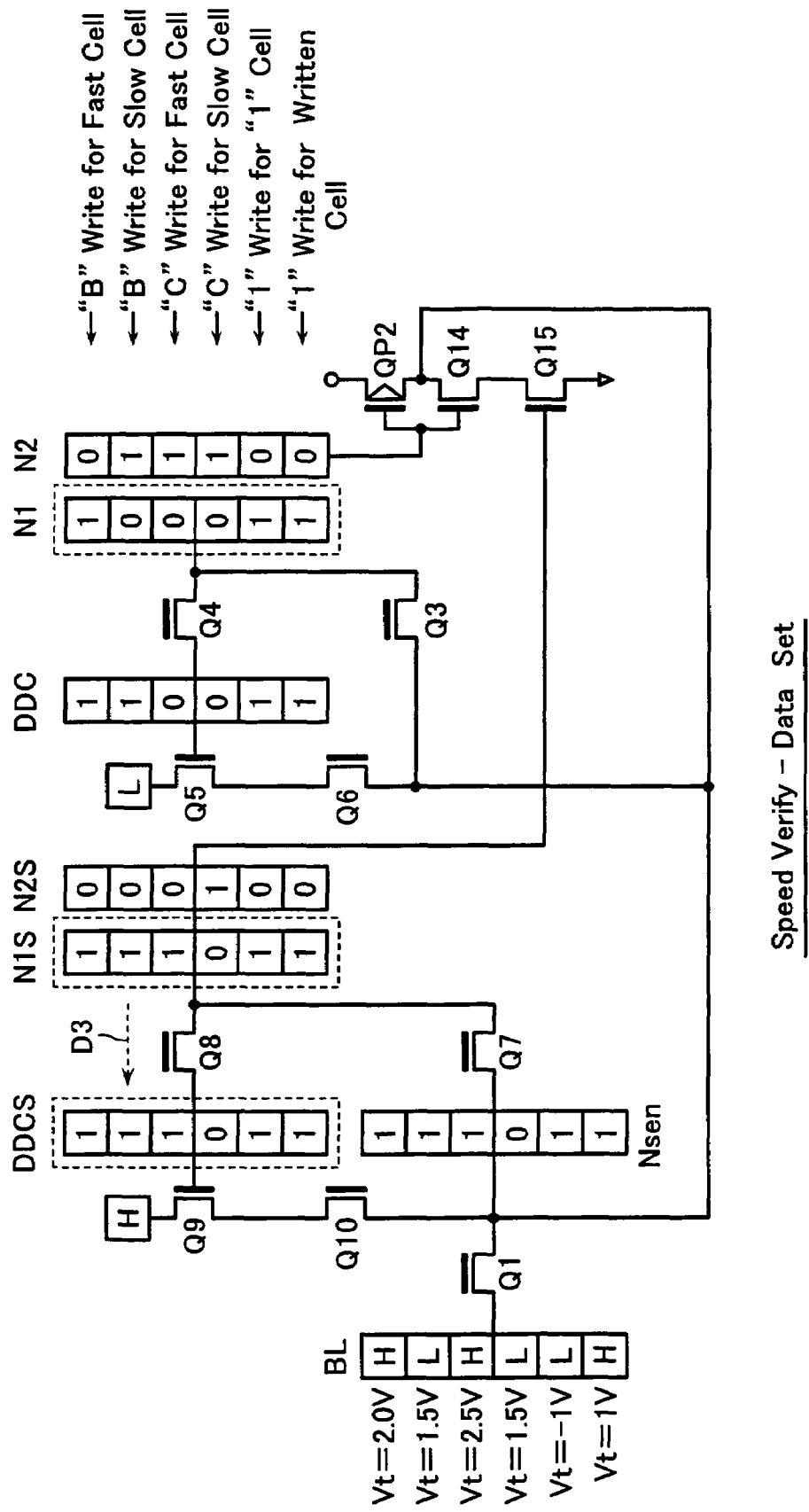
FIG. 25D is a diagram for showing data transition (data transferring) in the sense unit at the speed verify time.

Initially, as shown in FIG. 25C, apply a "H" level voltage to the drain of transistor Q9, thereby charging-up the sense node Nsen via the transistor Q9, which is selectively turned on in accordance with data stored at the node DDCS (charge-up operation D1). As a result, sense nodes Nsen corresponding to the data "B" write cells and data "1" write cells become "1", while only a sense node corresponding to data "C" write slow cell becomes "0".

Next, transfer transistor Q7 is turned on, so that data at the sense node Nsen is transferred to the node N1S of data latch 12 (transfer operation D2). Further, as shown in FIG. 25D, data at the node N1S is transferred to the node DDCS (transfer operation D3).

As a result of the above-described data processing, the nodes N1S and DDCS become to store the speed discriminating data of data "C" write cells (i.e., "1" designating fast cell; and "0" designating slow cell), and the entire data corresponding to the remaining cells become "1".

The write method of this embodiment will be summarized as follows. This embodiment is on the assumption that "parallel write" is performed as follows: a first data state, a second data state, the threshold of which is higher than the first data state, and a third data state, the threshold of which is higher than the first and second data states, are written in parallel. Note here that the "parallel write" is defined by such a sequence control that the write cycle for writing the second data state is overlapped to at least the latter half of that for writing the first data state; and at least the latter half of the write cycle for writing the second data state is overlapped to at least the former half of that for writing the third data state.

Further, in this embodiment, (a) in the write cycle of the first data state, the write pulse application is optimized based on the first speed verify result so that the fast cells and slow cells are alternately written under different conditions; (b) to write the second data state within the write cycle of the first data state, slow cell-use write pulses are used; (c) in the write cycle of the third data state, the write pulse application is optimized based on the second speed verify result so that the fast cells and slow cells are alternately written under different conditions; and (d) to write the third data state after the second speed verify, fast cell-use write pulses within the write cycle of the third data state are used.

According to the above-described write sequence control, the write-verify number may be reduced, and the write time may be made short. Giving attention to the second write cycle, which is overlapped to the first and third write cycles, as a result of that the write pulses are switched between (b) and (d), the step-up voltage range of the write pulses may be substantially equalized.

Embodiment 7

In the above-described Embodiments 1-6, there is such a case that the write pulse application operations to fast cells and slow cells are continued without the write-verify operation inserted therebetween.

Figure 26:
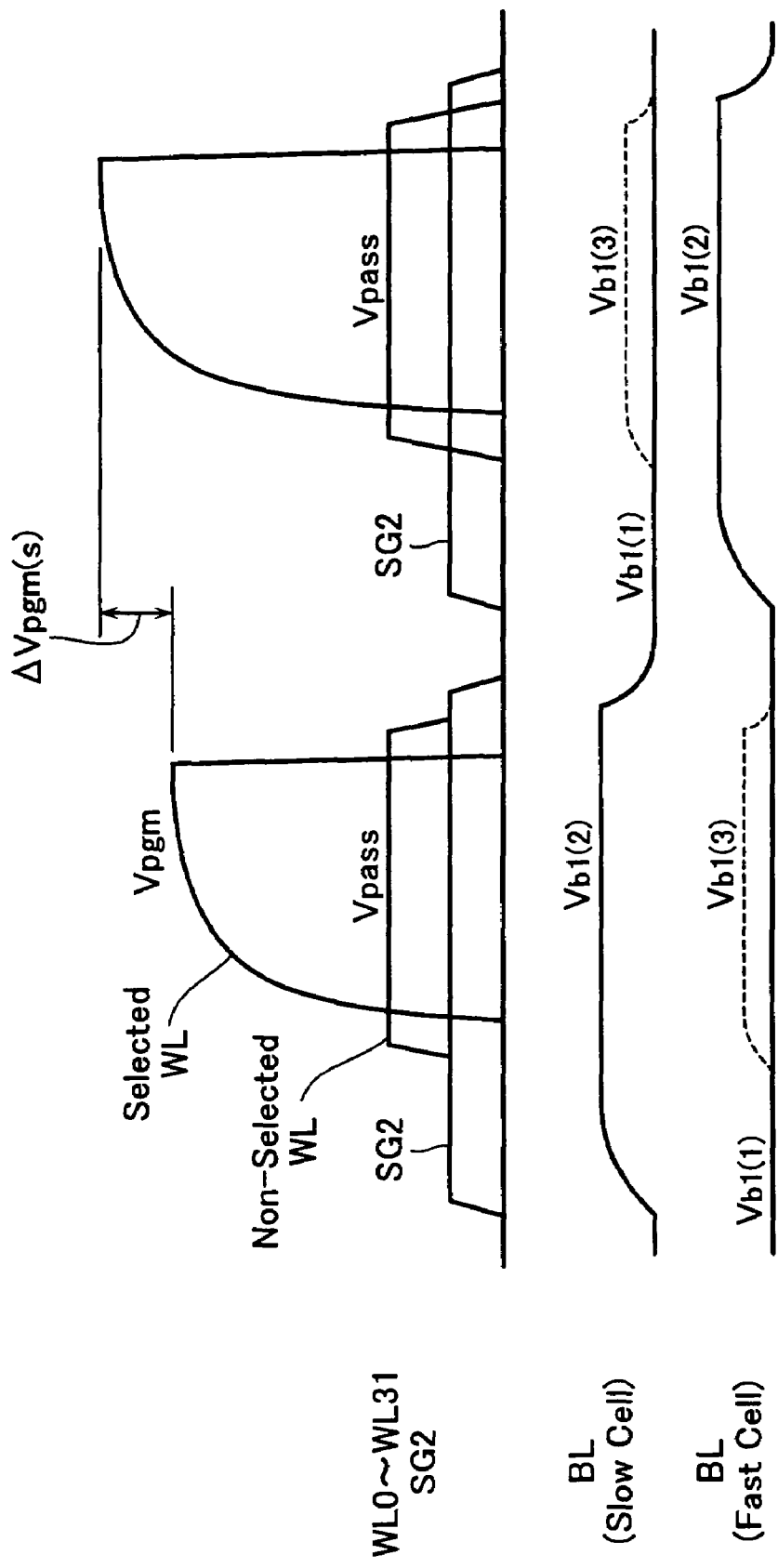
FIG. 26 is a diagram for showing voltage waveforms in a case where write pulses are continued in the respective embodiments.

FIG. 26 shows an example of waveforms in the above-described case where the write pulses are continued. As shown in FIG. 26, the write pulse Vpgm applied to the selected word line is applied together with the pass voltage Vpass applied to non-selected word lines and driving voltage applied to the select gate line SG2. Voltage applied to the bit line as write data is either one of "0" write-use voltage Vbl(1) (for example, 0V) and "1" write-use (i.e., "0" write-inhibiting) voltage Vbl(2) (for example, Vdd). In FIG. 26, fast cell write and slow cell write are continued in this order, and the bit line voltage is switched as synchronous with the write pulse switching.

FIG. 26 shows that there is a case where bit line voltage Vbl(3) (which is higher than Vbl(1) and lower than Vbl(2), for example 1V) is used as shown by dotted lines. This shows such a case that the bit line voltage is controlled for suppressing "0" write at the final stage of a write cycle.

The above-described bit line voltage control is effective for making the write data threshold distribution narrow. Especially, it is effective to adapt the above-described bit line voltage control to multi-level data storage schemes, and high-speed multi-level data write may be made possible.

APPLICATION DEVICES

As an embodiment, an electric card using the non-volatile semiconductor memory devices according to the above-described embodiments of the present invention and an electric device using the card will be described bellow.

Figure 27:
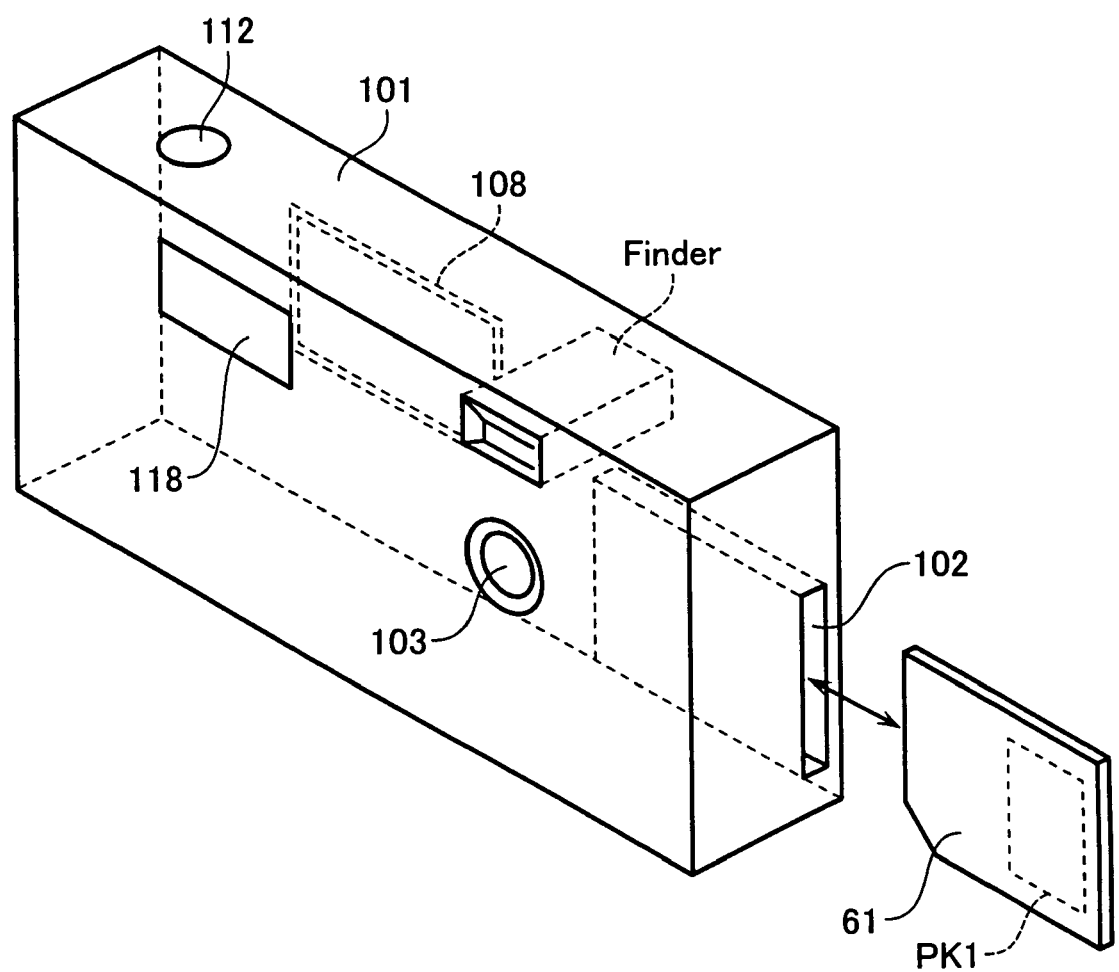
FIG. 27 shows another embodiment applied to a digital still camera.

FIG. 27 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

FIG. 28 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 29A to 29J, as well as in portable electric devices.

Figure 29A:
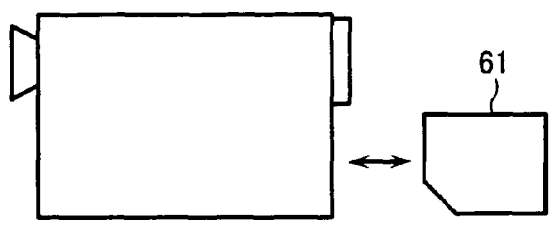
FIGS. 29A to 29J show other electric devices to which the embodiment is applied.
Figure 29F:
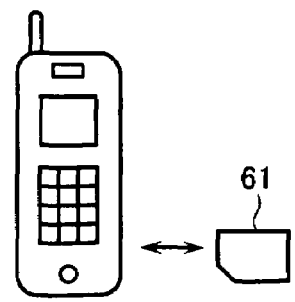
Figure 29B:
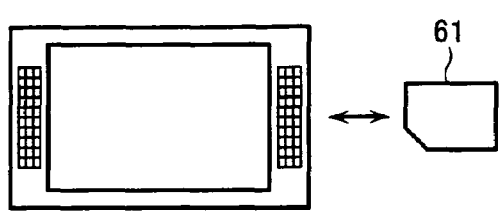
Figure 29G:
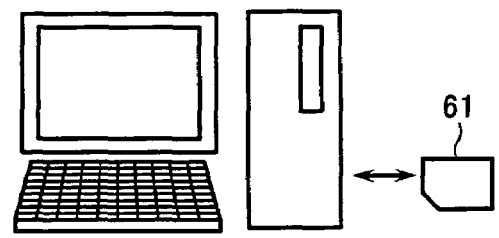
Figure 29C:
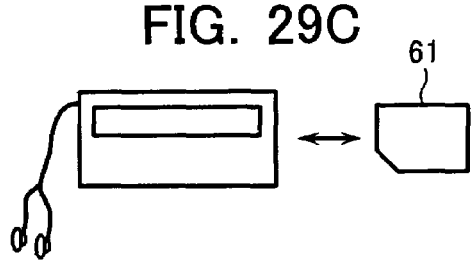
Figure 29H:
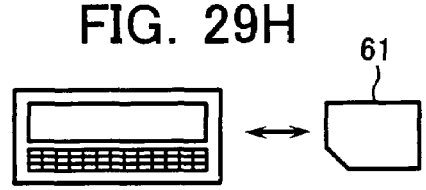
Figure 29D:
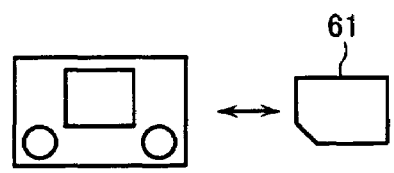
Figure 29I:
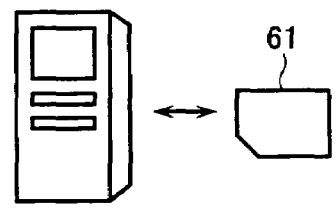
Figure 29E:
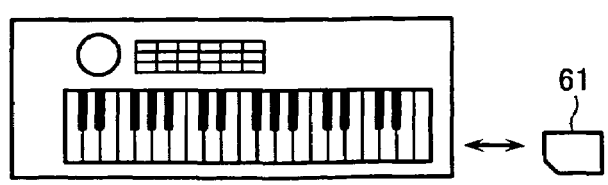
Figure 29J:
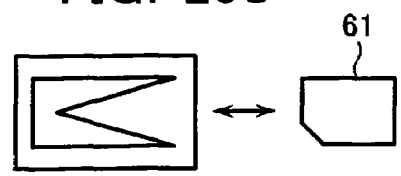

That is, the electric card can also be used in a video camera shown in FIG. 29A, a television set shown in FIG. 29B, an audio apparatus shown in FIG. 29C, a game apparatus shown in FIG. 29D, an electric musical instrument shown in FIG. 29E, a cell phone shown in FIG. 29F, a personal computer shown in FIG. 29G, a personal digital assistant (PDA) shown in FIG. 29H, a voice recorder shown in FIG. 29I, and a PC card shown in FIG. 29J.

This invention is not limited to the above-described embodiments. It will be understood by those skilled in the art that various changes in form and detail may be made without departing from the spirit, scope, and teaching of the invention.

What is claimed is:

1. A non-volatile semiconductor memory device comprising:
   a memory cell array having electrically rewritable and non-volatile semiconductor memory cells arranged therein; and a sense amplifier circuit configured to read data of and hold data to be written into the memory cell array,
   the device being internally controlled to execute a write sequence with write pulse applications and write-verify operations repeated for writing a set of memory cells selected in the memory cell array,
   wherein the sense amplifier circuit performs, after a certain write pulse application at the beginning of the write sequence, a write speed verify operation for detecting write speed of plural memory cells to be written into a certain data state, thereby getting discriminating data for classifying the plural memory cells into first and second cell groups,
   the write speed of the memory cell in the second cell group being lower than that in the first cell group, and wherein after the write speed verify operation, the first and second cell groups are alternately written on different write conditions from each other with reference to the discriminating data.

2. The non-volatile semiconductor memory device according to claim 1, wherein
   a first write pulse application for writing the first cell group and a second write pulse application for writing the second cell group are sequentially performed, the first and second write pulses being different in voltage from each other, following it a write verify operation is performed for both of the first and second cell groups on the same condition at a time.

3. The non-volatile semiconductor memory device according to claim 1, wherein
after the write speed verify operation, write data transferred to the first and second cell groups are alternately inverted based on the discriminating data held in the sense amplifier circuit.

4. The non-volatile semiconductor memory device according to claim 1, wherein
after the write-verify operation, a write-completion detection is performed for detecting whether the entire selected memory cells have been written or not.

5. The non-volatile semiconductor memory device according to claim 4, wherein
the write-completion detection is performed during the write pulse application.

6. The non-volatile semiconductor memory device according to claim 1, wherein
after the write verify operation, write-completion detections are performed with respect to the first and second cell groups, respectively, for detecting whether the memory cells have been written or not, and after the write-completion has been detected for one cell group, the write pulse application is successively performed for only the other cell group.

7. The non-volatile semiconductor memory device according to claim 6, wherein
the write-completion detections are performed during the write pulse applications for the first and second cell groups, respectively.

8. The non-volatile semiconductor memory device according to claim 1, wherein
the memory cell array has NAND cell units arranged therein, each NAND cell unit having plural memory cells connected in series and select gate transistors disposed at the both ends thereof.

9. The non-volatile semiconductor memory device according to claim 1, wherein
the sense amplifier circuit has plural sense units for simultaneously reading data of or simultaneously writing data into the set of memory cells selected in the memory cell array, and wherein each the sense unit includes:
a first data latch, in which write data is loaded;
a write-back circuit disposed in association with the first data latch for writing-back write data of the next write cycle into the first data latch based on the write verify-read data;
a second data latch disposed in parallel with the first data latch, to which the write data loaded in the first data latch is transferred at the beginning of the write sequence, and the discriminating data obtained by the write speed verify operation is held in;
a write speed switching circuit disposed in association with the second data latch, which serves for switching bit line control voltage for the purpose of alternately writing the first and second cell groups based on the discriminating data held in the second data latch; and
a bit line drive circuit, which is so controlled by data held in the first and second data latches as to generate a bit line control voltage required at a data write time in corporation with the write speed switching circuit.

10. The non-volatile semiconductor memory device according to claim 9, further comprising a write-completion detection circuit, which checks write data held in the first data latch with reference to the discriminating data held in the second data latch in each the sense unit to detect write-completion for each of the first and second cell groups.

11. The non-volatile semiconductor memory device according to claim 10, wherein the write-completion detection circuit has plural completion detection units for detecting write-completion in the entire sense units, each write-completion detection unit serving for detecting write-completion in plural sense units.

12. The non-volatile semiconductor memory device according to claim 1, wherein
the write sequence is for writing at least two, first and second, data states simultaneously into the set of memory cells, and wherein
the sense amplifier circuit performs a write speed verify operation for detecting write speed of plural memory cells to be written into at least the first data state after a certain write pulse application at the beginning of the write sequence, thereby getting discriminating data for classifying the plural memory cells into first and second cell groups, the write speed of the memory cell in the second cell group being lower than that in the first cell group, and wherein
after the write speed verify operation, the first and second cell groups are alternately written on different write conditions from each other with reference to the discriminating data.

13. The non-volatile semiconductor memory device according to claim 12, wherein
the first and second data states are defined by a first threshold distribution and a second threshold distribution higher than the first threshold distribution, respectively;
in the write cycle of the first data state, the first and second cell groups are alternately written with first and second write pulses each sequentially stepped-up, the second write pulses being higher than the first write pulses, and a first write-verify operation is performed after each of the first and second write pulse applications on the same condition at a time; and wherein
data write in the former half of a write cycle of the second data state is performed with the second write pulses in the write cycle of the first data state, and a second write-verify operation thereof is performed as following the first write verify operation while data write in the latter half thereof is performed with third write pulses as following the second write pulses and third write-verify operations repeated.

14. The non-volatile semiconductor memory device according to claim 13, wherein
write-completion detections for the first data state are performed during the first and second write pulse applications for the first and second cell groups, respectively, within the memory cells to be written into the first data state in the write cycle of the first data state; and wherein
write-completion detections for the second data state are performed during each the second write pulse application in the former half while during each the third write pulse application in the latter half.

15. The non-volatile semiconductor memory device according to claim 1, wherein
the write sequence is for writing at least three, first, second and third, data states simultaneously into the set of memory cells, the three data states being arranged in order of the threshold voltage height, and wherein
the sense amplifier circuit performs a first write speed verify operation for detecting write speed of memory cells to be written into the first data state after a certain write pulse application at the beginning of the write sequence, thereby getting first discriminating data for classifying the memory cells into first and second cell groups, the write speed of the memory cell in the second cell group being lower than that in the first cell group, and performs a second write speed verify operation for detecting write speed of memory cells to be written into the third data state halfway in the write sequence, thereby getting second discriminating data for classifying the memory cells into third and fourth cell groups, the write speed of the fourth cell group being lower than that in the third cell group;

in the former half of the write sequence, the first and second cell groups are alternately written with first and second write pulses, respectively, in the memory cells to be written into the first data state with reference to the first discriminating data, the second write pulses being higher than the first write pulses;

in the latter half of the write sequence, the third and fourth cell groups are alternately written with third and fourth write pulses, respectively, in the memory cells to be written into the third data state with reference to the second discriminating data, the fourth write pulses being higher than the third write pulses; and the second write pulses applied to the second cell group and the third write pulses applied to the third cell group are used for writing the memory cells to be written into the second data state.

16. The non-volatile semiconductor memory device according to claim 1, wherein the write speed in the write speed verify operation is determined by detecting a threshold voltage shift state of the memory cells.

17. A method of writing data into a set of memory cells in a non-volatile semiconductor memory device with write pulse applications and write-verify operations repeated, comprising:

performing, after a certain write pulse application at the beginning of a write sequence, a write speed verify operation for detecting write speed of plural memory cells to be written into a certain data state, thereby getting discriminating data for classifying the plural memory cells into first and second cell groups, the write speed of the memory cell in the second cell group being lower than that in the first cell group; and alternately writing the first and second cell groups on different write conditions from each other with reference to the discriminating data after the write speed verify operation.

18. The method of writing data according to claim 17, wherein the write sequence is for writing at least two, first and second, data states simultaneously into the set of memory cells;

the write speed verify operation is performed for detecting write speed of memory cells to be written into at least the first data state;

with respect to the memory cells to be written into the first data state, the first and second cell groups are alternately written with first and second write pulses, respectively, which are stepped-up as being different from each, with reference to the discriminating data, after the write speed verify operation; and memory cells to be written into the second data state are written with the second write pulses simultaneously with the second cell group, and successively written with third write pulses stepped-up.

19. The method of writing data according to claim 17, wherein the write sequence is for writing at least three, first, second and third, data states simultaneously into the set of memory cells, the three data states being arranged in order of the threshold voltage height;

a first write speed verify operation is performed for detecting write speed of memory cells to be written into the first data state after a certain write pulse application at the beginning of the write sequence, so as to get first discriminating data for classifying the memory cells into first and second cell groups, the write speed of the memory cell in the second cell group being lower than that in the first cell group;

in the former half of the write sequence, the first and second cell groups are alternately written with first and second write pulses, respectively, in the memory cells to be written into the first data state with reference to the first discriminating data, the second write pulses being higher than the first write pulses;

a second write speed verify operation is performed for detecting write speed of memory cells to be written into the third data state halfway in the write sequence, so as to get second discriminating data for classifying the memory cells into third and fourth cell groups, the write speed of the fourth group being lower than that in the third cell group;

in the latter half of the write sequence, the third and fourth cell groups are alternately written with third and fourth write pulses, respectively, in the memory cells to be written into the third data state with reference to the second discriminating data, the fourth write pulses being higher than the third write pulses; and the second write pulses applied to the second cell group and the third write pulses applied to the third cell group are used for writing the memory cells to be written into the second data state.

* * * * *

UNITED STATES PATENT AND TRADEMARK OFFICE
CERTIFICATE OF CORRECTION

| | |
|---|---|
| PATENT NO. | : 7,492,641 B2 |
| APPLICATION NO. | : 11/455823 |
| DATED | : February 17, 2009 |
| INVENTOR(S) | : Hosono et al. |

It is certified that error appears in the above-identified patent and that said Letters Patent is hereby corrected as shown below:

On the title page, Item (30), The Foreign Application Priority Data has been omitted. Item (30) should read:

-- (30)         Foreign Application Priority Data

June 22, 2005         (JP) ………………………...2005-181879 --

Signed and Sealed this

Fourteenth Day of April, 2009

JOHN DOLL
*Acting Director of the United States Patent and Trademark Office*